United States Patent [19]

Ushida et al.

[11] Patent Number: 4,734,746
[45] Date of Patent: Mar. 29, 1988

[54] EXPOSURE METHOD AND SYSTEM FOR PHOTOLITHOGRAPHY

[75] Inventors: Kazuo Ushida, Tokyo; Satoru Anzai, Zama; Kazuaki Suzuki; Toshio Matsuura, both of Tokyo; Kyoichi Suwa, Yokohama; Koichi Matsumoto, Tokyo, all of Japan

[73] Assignee: Nippon Kogaku K. K., Tokyo, Japan

[21] Appl. No.: 51,236

[22] Filed: May 12, 1987

Related U.S. Application Data

[63] Continuation of Ser. No. 876,485, Jun. 20, 1986, abandoned.

[30] Foreign Application Priority Data

Jun. 24, 1985 [JP] Japan .................. 60-137629
Jul. 3, 1985 [JP] Japan .................. 60-146340
Jul. 24, 1985 [JP] Japan .................. 60-163489

[51] Int. Cl.$^4$ .................. G03B 27/32; G03B 27/42
[52] U.S. Cl. .................. 355/53; 355/77
[58] Field of Search .................. 355/43, 46, 53, 54, 355/55, 77

[56] References Cited

U.S. PATENT DOCUMENTS

| | | | |
|---|---|---|---|
| 3,716,296 | 2/1973 | Springer et al. | 355/53 |
| 4,155,642 | 5/1979 | Lacombat | 355/53 |
| 4,397,543 | 8/1983 | Kolbe et al. | 355/53 X |
| 4,505,580 | 3/1985 | Michel | 355/55 X |
| 4,506,977 | 3/1985 | Sato et al. | 355/53 |

Primary Examiner—Richard A. Wintercorn
Attorney, Agent, or Firm—Shapiro and Shapiro

[57] ABSTRACT

An exposure method for photolithography comprises the steps of forming a pattern on a substrate by the use of a first exposure apparatus including a first imaging optical system having a reduction magnification $1/\beta 1$ and an image circle of a diameter $\phi 1$, and forming a second pattern on the substrate on which the first pattern has been formed, by the use of a second exposure apparatus including a second imaging optical system having a reduction magnification $1/\beta 2$ different from the reduction magnification $1/\beta 1$ and an image circle of a diameter $\phi 2$, wherein when N is an integer, the conditions that $\beta 1 \times \phi 1 = \beta 2 \times \phi 2$ and $\phi 1 = N \times \phi 2$ are satisfied.

19 Claims, 37 Drawing Figures

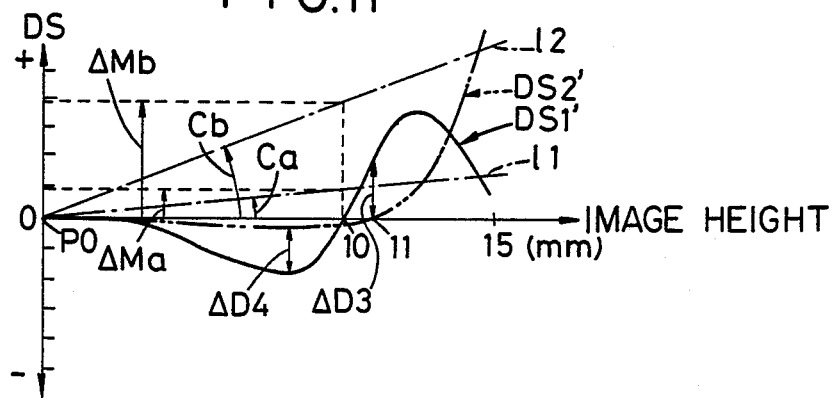
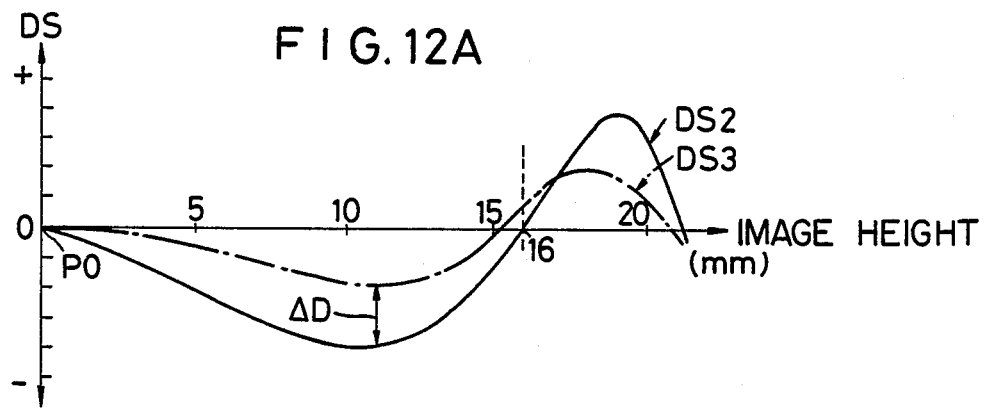
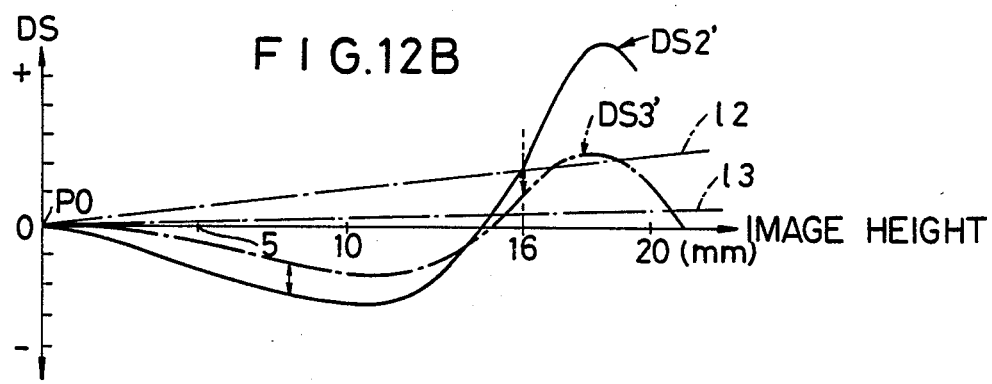

F I G. 27
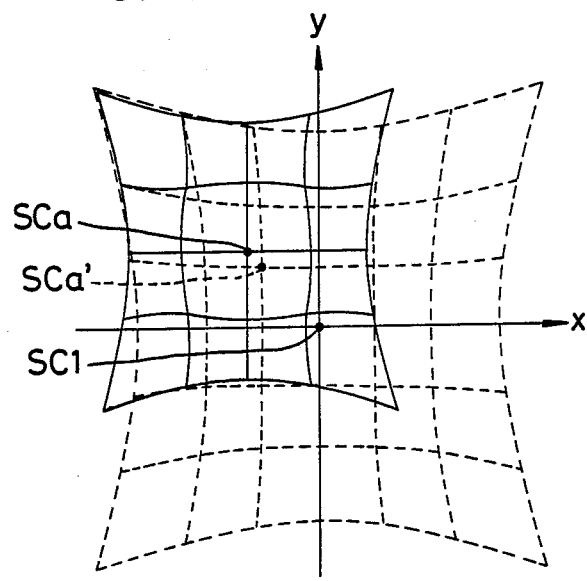
F I G. 28
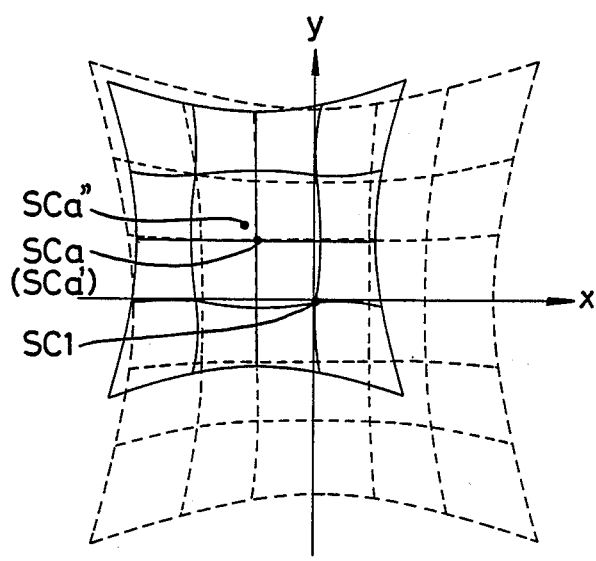

EXPOSURE METHOD AND SYSTEM FOR PHOTOLITHOGRAPHY

This is a continuation application of Ser. No. 876,485 filed June 20, 1986, now abandoned.

BACKGROUND OF THE INVENTION

1. Field of the Invention

This invention relates to an exposure method and exposure system in the photolithography process, and in particular to a method and system using a plurality of exposure apparatuses to achieve precise photolithography.

2. Related Background Art

In recent years, reduction projection type exposure apparatuses have been used for the manufacture of super-LSI and have rendered great services in the improvement of productivity. Of the projection exposure apparatuses of the type, it is required to improve the superposition accuracy during the superposition exposure between different layers on semiconductor wafers, along with the tendency toward minuteness of the line width of the pattern on reticles to be projected and exposed and the tendency of the patterns themselves toward higher integration. This is particularly remarkable between different apparatuses. Recently, various projection exposure apparatuses different in numerical aperture, magnification or exposure area (projection field of view) have appeared and in super-LSI manufacturing factories, the exposure between different layers has often been used properly between discrete apparatuses in one process of manufacture of super LSI with the resolving power and throughput required being taken into account.

For example, there is known the so-called mix- and-matching manufacturing method in which, for example, proximity type exposure apparatuses or mirror projection aligners are used for the exposure of relatively large patterns and reduction projection type exposure apparatuses are used for the exposure of more minute patterns. In the case of this mix-and-matching, exposure apparatuses different in projection magnification and projection field of view or apparatuses different in exposure system like refracting systems or reflecting systems are used together and therefore, the matching accuracy becomes particularly important. As a factor which governs the matching accuracy, mention may be made of the distortion of projection optical systems. Generally, even in projection optical systems of the same structure, the distortion characteristic delicately differs at every system, and between projection optical systems different in magnification or field of view, the distortion characteristic may differ greatly. Accordingly, even if mix-and-match is effected by the use of such apparatuses, sufficient matching accuracy is not always obtained. This leads to a serious problem that productivity is reduced by unsatisfactory matching.

Further problems peculiar to the case of the mix-and-matching have been that the maintenance between entirely different apparatuses is cumbersome and that the presence of entirely different alignment marks on the masks and reticles necessary for the respective apparatuses makes the manufacture of the masks and reticles cumbersome and also leads to low efficiency of manufacture of semiconductive elements, which in turn has resulted in a bindrance to the enhancement of productivity.

SUMMARY OF THE INVENTION

It is an object of the present invention to provide novel method and system for achieving high production efficiency by the use of a plurality of different exposure apparatuses.

It is another object of the present invention to provide an exposure method and exposure system which reduce the reduction in matching accuracy by the distortion between different exposure apparatuses.

BRIEF DESCRIPTION OF THE DRAWINGS

FIG. 11 is a graph when magnification adjustment is further effected relative to the characteristic of FIG. 10.

FIGS. 12A and 12B are graphs for illustrating the improvement of the matching accuracy in the case of exposure apparatuses identical in the size of the projection field of view.

FIG. 13 being a plan view showing the shot arrangement by the step-and-repeat system, FIG. 14 being a chart exaggeratingly showing the projected image of the ideal lattice point by a stepper, FIG. 15 being a chart exaggeratingly showing the state of superposition by two steppers by the use of the ideal lattice point, FIG. 16 being a graph showing an example of the distortion characteristic, FIG. 17 illustrating the shift of a wafer, FIG. 18 is a chart showing the state of superposition after the wafer is shifted, FIG. 19 is a graph comparing the distortion characteristics of two steppers when the wafer is shifted, FIG. 20 being a graph comparing the two distortion characteristics when magnification adjustment is effected, FIG. 21 being a chart showing the state of superposition when the shift of the wafer and magnification adjustment are effected, and FIG. 22 showing the shift vector of each shot during the step-and-repeat exposure.

FIG. 27 is a chart showing the state of matching when superposition is effected as per the design shot position.

FIG. 28 is a chart showing the state of matching when the wafer is shifted from the state of FIG. 27.

DESCRIPTION OF THE PREFERRED EMBODIMENTS

A first embodiment of the present invention will hereinafter be described with respect to two projection exposure apparatuses A and B shown in FIGS. 1A and 1B.

Figure 1A:
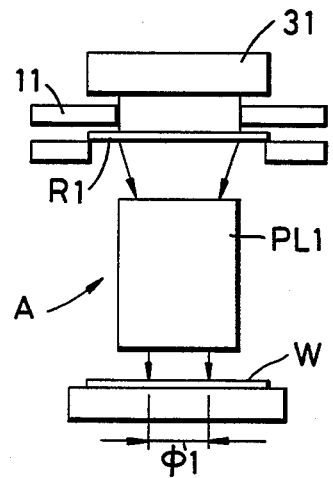
FIGS. 1A and 1B are schematic front views of first and second projection exposure apparatuses, respectively, according to a first embodiment of the present invention.

The first projection exposure apparatus A is a so-called stepper which reduction-projects a predetermined pattern on a reticle $R_1$ onto a wafer W by a projection lens $PL_1$, as shown in FIG. 1A. The reticle $R_1$ is accurately placed at a predetermined position on a reticle stage by a reticle alignment system 11 and is uniformly illuminated by an illuminating optical system 31. The pattern on the reticle $R_1$ is reduction-projected onto the wafer W placed on a wafer stage, whereby one-shot exposure is effected.

The projection lens $PL_1$ is of a low reduction rate and has a wide field of view and a certain degree of resolving power, and when the reduction magnification thereof is $1/\beta_1$ and the diameter of the image circle on the wafer is $\phi_1$. the diameter of the effective area on the reticle $R_1$ is $\beta_1 \times \phi_1$. In practice, exposure of a predetermined pattern is effected in the rectangular projection field of view within the image circle.

Figure 2A:
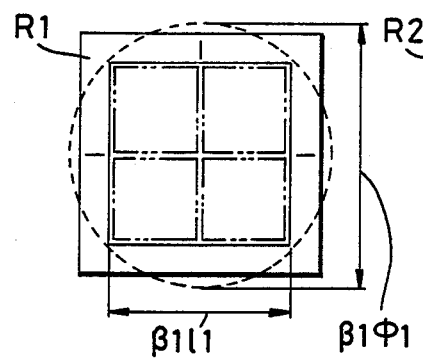
FIGS. 2A and 2B are plan views of first and second reticles, respectively.
Figure 3A:
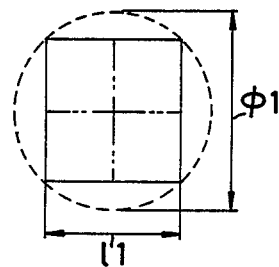
FIGS. 3A and 3B are plan views of first and second projection fields of view, respectively.

So, assuming as an example that a predetermined pattern is exposed and printed on a square projection field of view having each side $l_1$ long which is inscribed to the image circle, the effective pattern area on the reticle $R_1$ is a square having each side $\beta_1 \times l_1$ long. Accordingly, as shown in FIG. 2A, the reticle $R_1$ has a square effective pattern area having each side $\beta_1 \times l_1$ long and a predetermined exposure pattern is formed in this area. On the wafer W, as shown in FIG. 3A, exposure and printing is done in a square projection field of view having each side $l_1$ long.

Figure 1B:
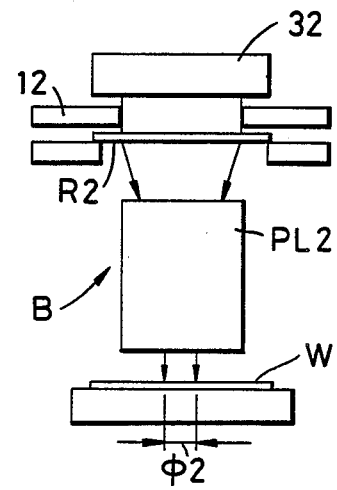

The second projection exposure apparatus B shown in FIG. 1B has a construction similar to that of the first projection exposure apparatus A, and the pattern of a reticle $R_2$ placed on the reticle stage is projected onto the wafer W, whereby one-shot exposure is effected. A projection lens $PL_2$ is of a high reduction rate and has a narrow field of view and a more excellent resolving power than the projection lens $PL_1$. When the reduction magnification thereof is $1/\beta_2$ and the diameter of the image circle on the wafer is $\phi_2$, the diameter of the effective area on the reticle $R_2$ is $\beta_2 \times l_2$. If the length of each side of a square inscribed to the image circle is $l_2$, the effective pattern area on the reticle $R_2$ is a square having each side $\beta_2 \times l_2$ long as shown in FIG. 2B.

Figure 2B:
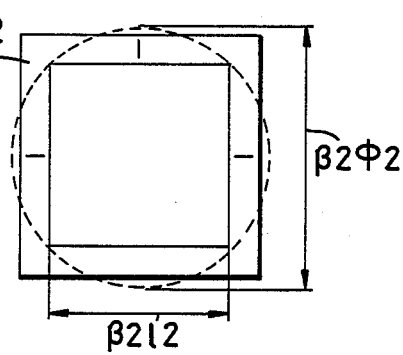

As shown in FIGS. 2A and 2B, an actual square pattern area inscribed to the circular effective area indicated by broken line is formed on each reticle, and a reticle alignment mark is formed at the intermediate position between the two.

The two projection exposure apparatuses as described above have such a relation that satisfies the following conditions.

$$\beta_1 \times \phi_1 = \beta_2 \times \phi_2 \qquad (1)$$

$$\phi = N \times \phi_2 \qquad (2)$$

(N is an integer.)

Figure 3B:
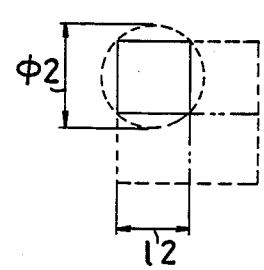

Due to the above-mentioned equation (1), the effective pattern areas on the reticles necessary for the respective projection exposure apparatuses are equal in size. That is, the reticles $R_1$ and $R_2$ shown in FIGS. 2A and 2B can be made equal in size. Also, according to equation (2) above, as shown in FIGS. 3A and 3B, the projection field of view on the wafer by the first projection exposure apparatus A is just integer times the projection field of view on the wafer by the second projection exposure apparatus B. The example illustrated is a case where $$\phi = 2 \times \phi_2,$$

that is, a case where the relation that $$l_1 = 2 \times l_2$$

is established with regard to the length of each side of the square projection field of view, and as shown in FIG. 3A, the one-shot exposure area by the first projection exposure apparatus corresponds to four shots of the one-shot exposure area by the second projection exposure apparatus.

Accordingly, it is effective to use such two projection exposure apparatuses properly for a certain wafer in conformity with the line widths of various patterns projected and printed during the projection exposure repetitively effected via exposure, development and etching. That is, with regard to a pattern of relatively great line width, four chips can be projected and exposed at the one shot by the first projection exposure apparatus of low reduction rate by forming a pattern of four chips on a reticle. Also, with regard to a minute pattern of small line width, projection exposure of a chip is effected at the one shot by the second projection exposure apparatus of high reduction rate by forming a pattern of a chip on a reticle $R_2$. Thus, where the resolving power is not so much required, exposure of a plurality of chips is effected at one shot by a projection exposure apparatus having a projection lens of low reduction rate and wide field of view, and in the case of a pattern of which a high resolving power is required, one chip is exposed at one shot each by a projection exposure apparatus carrying thereon a projection lens of high reduction rate and narrow field of view and yet having a high resolving power, and if the projection exposure apparatuses are used properly in conformity with the resolving power necessary for the projection of a pattern, the throughput as a whole can be markedly improved.

The order of the exposure of four chips at one shot by the first projection exposure apparatus and the exposure of one chip at one shot by the second projection exposure apparatus is not particularly restricted, but the first and second projection exposure apparatuses may be used properly in accordance with the structure of a circuit pattern formed on the wafer and in conformity with the order of the lithography of very minute patterns and pattern of no so small line width.

Figure 4:
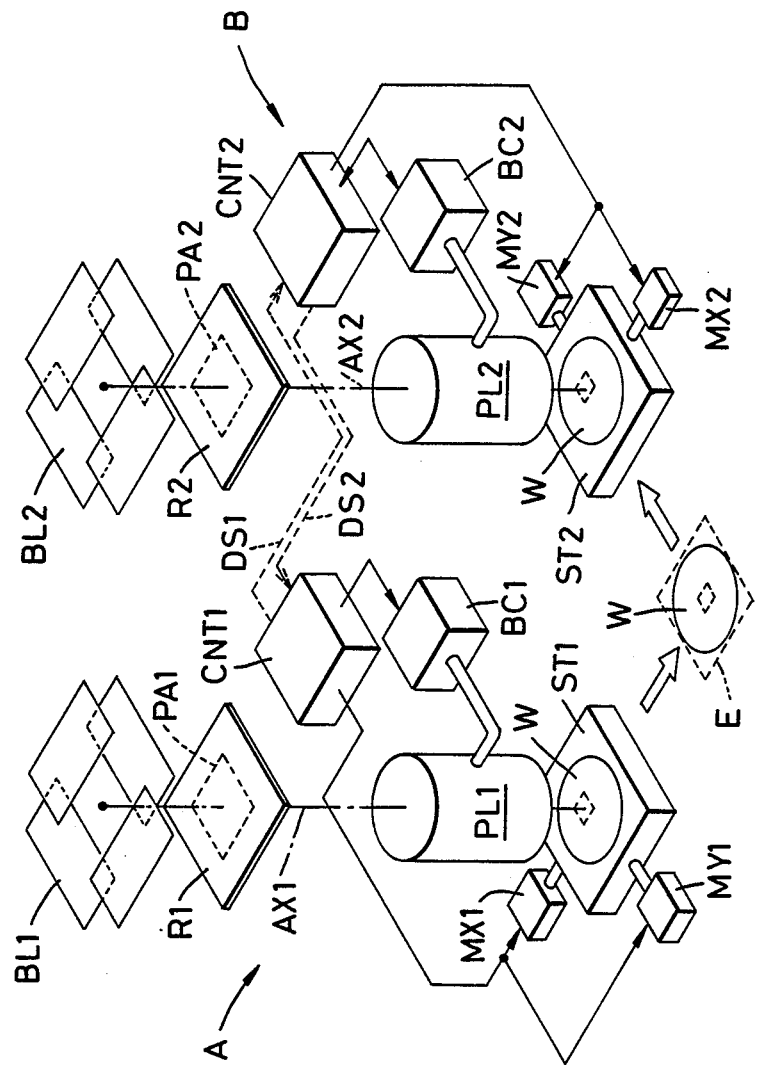
FIG. 4 is a perspective view schematically showing a projection exposure system according to a second embodiment of the present invention.

A second embodiment of the present invention will now be described with reference to FIG. 4. FIG. 4 schematically shows the construction of an exposure system having two steppers A and B different in the size of the projection field of view. In the present embodiment, it is to be understood that the projection lens $PL_1$ of the stepper A is of a reduction magnification of 1/5 and its projection field of view on the wafer W is 20×20 mm (a circular area of a diameter of 28 mm) and that the projection lens $PL_2$ of the stepper B is of a reduction magnification of 1/2.5 and its projection field of view on the wafer W is 30×30 mm (a circular area of a diameter of 42 mm). The stepper A is provided with a blind $BL_1$ as a field stop which illuminates only a pattern area $PA_1$ on a reticle $R_1$ to be exposed, and the shape and size of the opening portion are adjusted by four movable blades. The reticle $R_1$ is mounted so that the center of the pattern area $PA_1$ is coincident with the optic axis (the center of the field of view) $AX_1$ of the projection lens $PL_1$.

Now, the wafer W loaded into the stepper A is placed on a stage $ST_1$ two-dimensionally moved in x and y directions by motors $MX_1$ and $MY_1$, and the projected image of the pattern area $PA_1$ by the projection lens $PL_1$ is successively exposed on the wafer W by the step and repeat system. The projection lens $PL_2$ in the present embodiment is provided with a pressure adjuster $BC_1$ for controlling the pressure (atomspheric pressure) in the air space portion between a plurality of lenses constituting the projection lens and finely adjusting the magnification of the projection lens $PL_1$, and this pressure adjuster is operated so that a desired projection magnification may be obtained in response to the set information from a main control device $CNT_1$. The constructions, operations and uses of the pressure adjuster $BC_1$ and the main control device $CNT_1$ are disclosed in detail in U.S. application Ser. No. 632,335 filed on July 19, 1984 or U.S. application Ser. No. 656,777 filed on Oct. 1, 1984 and therefore need not be described herein.

On the other hand, the stepper B differs from the stepper A only in the size of the projection field of view of a projection lens $PL_2$, and a blind $BL_2$, motors $MX_2$ and $MY_2$, a stage $ST_2$, a pressure adjuster $BC_2$ and a main control device $CNT_2$ which form the basic construction of the stepper B are the same as those of the stepper A. Also, the pattern area $PA_2$ of the reticle $R_2$ mounted on the stepper B is made so as to be of the same dimensions on the wafer as the pattern area $PA_1$ of the reticle $R_1$. That is, assuming that the size of the pattern area $PA_1$ is 100×100 mm corresponding to the maximum field of view (20×20 mm) that can be projected by the projection lens $PL_1$, the projection lens $PL_2$ is used in the area of 20×20 mm, of the maximum projection field of view (30 ×30 mm). In the present embodiment, such steppers A and B are used for the superposition exposure between different layers formed on the wafer W.

Herein, for simplicity of description, it is to be understood that the exposure of the first layer to the wafer W is effected by the stepper A, whereafter a predetermined process E for the formation of the first layer is carried out and the superposition exposure of the second layer to the wafer W is effected by the stepper B.

For this purpose, the main control device $CNT_2$ of the stepper B receives the data $DS_1$ about the distortion of the projection lens $PL_1$ as the input from the main control device $CNT_1$ of the stepper A. The data $DS_1$ is pre-stored in the main control device $CNT_1$ as the inspection data during the manufacture of the stepper A. Alternatively, as shown in U.S. application Ser. No. 543,938 filed on Oct. 20, 1983, a photoelectric sensor with a slit may be provided on the stage $ST_1$, cross-shaped marks formed at a plurality of locations on a reticle for distortion inspection may be projected, the slit may be scanned in the projected image plane and the projected positions of the marks may be found, whereby the amount of distortion of a plurality of points in the projection field of view may be detected and pre-stored as the data $DS_1$. If the slit on the stage is thus used, at any time during the operation of the steppers, the distortion at the point of time can be accurately measured and the variation in distortion characteristic with time can be coped with.

Likewise, the data $DS_2$ about the distortion of the projection lens $PL_2$ of the stepper B is stored in the main control device $CNT_2$ and is sent to the main control device $CNT_1$ as the data in a case where the magnification of the stepper A is adjusted. Also, where the main control devices $CNT_1$ and $CNT_2$ are generally controlled by a control device of a higher rank (a large computer), the distortion data $DS_1$ of the projection lens $PL_1$ and the distortion data $DS_2$ of the projection lens $PL_2$ may likewise be sent to the control device of a higher rank and concentratedely controlled wherein.

Figure 5:
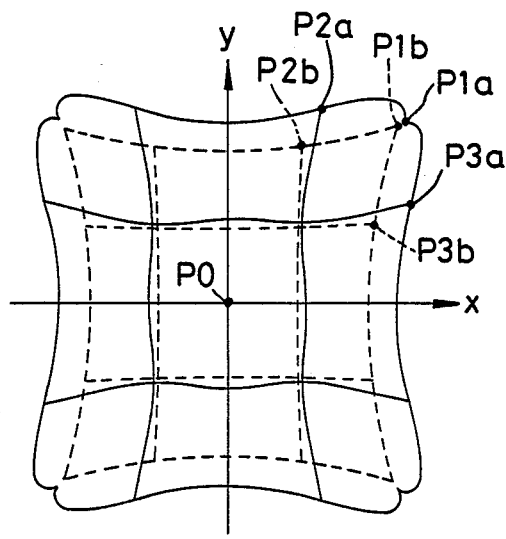
FIG. 5 is a chart exaggeratingly showing the deviation of the projected image of the ideal lattice point when superposition exposure is effected without magnification correction being effected.

FIG. 5 is a chart symbolically showing an example of the superposition accuracy (hereinafter referred to as the matching accuracy) in a case where superposition exposure is effected without effecting the correction of the magnifications of the two steppers A and B. In FIG. 5, solid lines are a chart representing the deviation of the stepper A from the ideal lattice point, and broken lines are a chart representing the deviation of the stepper B from the ideal lattice point. Assuming that the center of the projection field of view of the stepper A and the center of the projection field of view of the stepper B are made coincident with the origin $P_0$ of the rectangular coordinate system xy, in the first quadrant of the coordinate system xy, the points of projection of the ideal lattice point by the stepper A are $P_{1a}$, $P_{2a}$, $P_{3a}$, ... and the points of projection of the ideal lattice point by the stepper B are $P_{1b}$, $P_{2b}$, $P_{3b}$, .... As is apparent from this example, if the two steppers are mixed and matched by the alignment of the centers (optic axes), the matching accuracy in the vicinity of the center $P_0$ is sufficiently obtained, but at points far from the center $P_0$, for example, at points $P_{2a}$ and $P_{2b}$ or points $P_{3a}$ and $P_{3b}$, the amount of relative deviation may sometimes become significant. This amount of deviation depends on the distortion characteristic between the two projection lenses and does not always become great at each circumferential point.

Figure 6A:
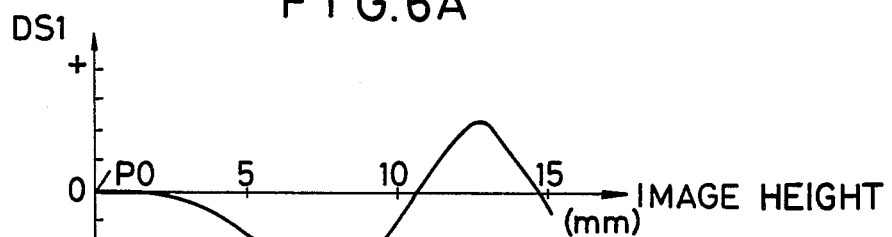
FIGS. 6A and 6B are graphs showing the distortion curves of the projection lenses of two exposure apparatuses, respectively.
Figure 6B:
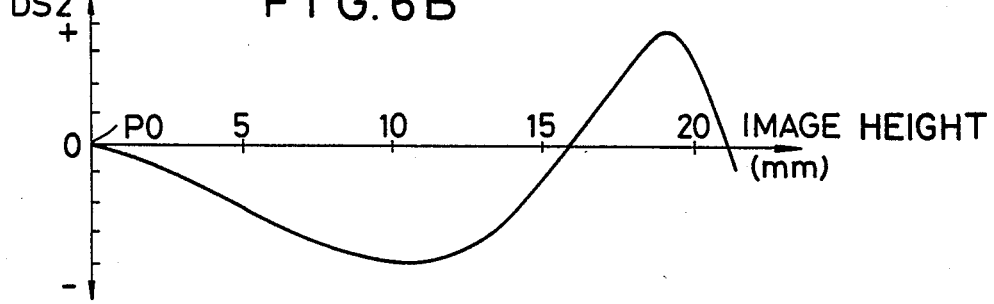

FIG. 6A shows an example of the distortion characteristic of the projection lens $PL_1$ which is memorized as data $DS_1$ in the main control device $CNT_1$, and FIG. 6B shows an example of the distortion characteristic of the projection lens $PL_2$ which is memorized as data $DS_2$ in the main control device $CNT_2$. In FIGS. 6A and 6B, the ordinate represents the amount of distortion and the abscissa represents the image height (the radial distance from the optic axis, i.e., the center $P_0$). The positive and negative of the amount of distortion are such that said amount is negative in a case where the point of projection of the ideal latticle point deviates toward the center $P_0$ and that said amount is positive in the converse case. The curves of the distortion characteristics of the two projection lenses are similar to each other in their general tendency, but the amounts of distortion at the same image height differ greatly from each other in accordance with the image height. In the projection lenses of this type, correction of distortion is effected so that the maximum value of the distortion in the positive direction becomes substantially equal to the maximum value of the distortion in the negative direction. This is for the purpose of bettering on average the distortion in the entire surface of the exposure area.

Figure 7:
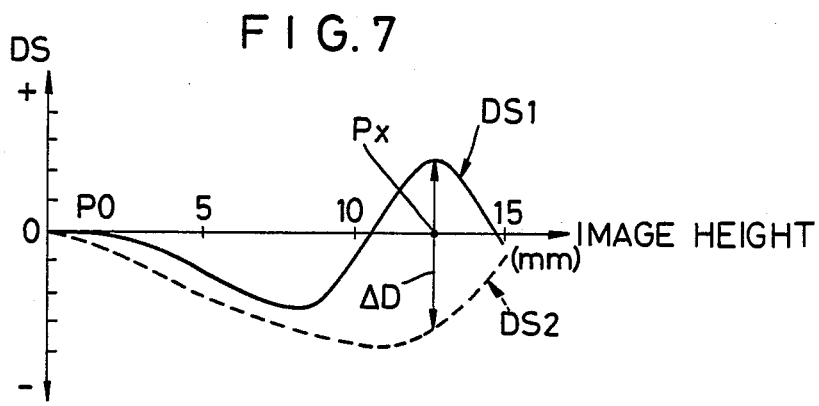
FIG. 7 is a graph showing the distortion curves in FIGS. 6A and 6B.

FIG. 7 shows the above-described two distortion characteristics superposed one upon the other at the centers thereof. It is to be understood that the projection magnifications of the steppers A and B are at the standard value (initial value). As is apparent from this Figure, the absolute value of the difference between the distortion characteristics $DS_1$ and $DS_2$ is extremely great from a point at which the image height is about 9 mm to the circumference and at the image height position Px, the absolute value $|\Delta D|$ of the difference $\Delta D$ is maximum. The amount of this difference $|\Delta D|$ is sometimes greater than the maximum value of the amount of distortion of one of the distortion characteristics $DS_1$ and $DS_2$. Thus, sufficient matching accuracy can hardly be obtained for the pattern lying at an image height position of about 9 mm or more. The case of FIG. 7 corresponds to the chart shown in FIG. 5.

So, in the present embodiment, the distortion characteristic $DS_1$ of the stepper A is kept unchanged and the distortion characteristic $DS_2$ of the stepper B is varied by finely adjusting the magnification so that the maximum value of the absolute value of the difference $\Delta D$ created in the projection field of view may be smallest when the two distortion characteristics are superposed one upon the other.

There will hereinafter be described a mathematical analysis for superposing the two distortion characteristics one upon the other and thereby making the matching accuracy best. The following analysis can be easily executed by the main control device $CNT_2$ of the stepper B or a computer such as a control device of a higher rank.

If the image height is $\gamma$ and the distortion curve is $f(\gamma)$ and the coefficient of magnification adjustment is C, the amount of deviation $\Delta(\gamma)$ from the ideal lattice point obtained by adjusting the magnification is represented as follows:

$$\Delta(\gamma) = f(\gamma) + C \cdot \gamma \quad (3)$$

If, correspondingly to this equation (3), the deviations from the ideal lattice point with respect to the steppers A and B are expressed by vectors ($\Delta Xa$, $\Delta Ya$) and ($\Delta Xb$, $\Delta Yb$), respectively, they will be as shown by equation (4) and (5), respectively, for the steppers A and B, respectively.

$$(\Delta Xa, \Delta Ya) = \{fa(\sqrt{x^2 + y^2}) + Ca\sqrt{x^2 + y^2}\} \times \left(\frac{x}{\sqrt{x^2 + y^2}}, \frac{y}{\sqrt{x^2 + y^2}}\right) \quad (4)$$

$$(\Delta Xb, \Delta Yb) = \{fb(\sqrt{x^2 + y^2}) + Cb\sqrt{x^2 + y^2}\} \times \left(\frac{x}{\sqrt{x^2 + y^2}}, \frac{y}{\sqrt{x^2 + y^2}}\right) \quad (5)$$

where suffixes a and b correspond to the steppers A and B, respectively.

Consequently, the difference vector ($\Delta X$, $\Delta Y$) of the final distortion when exposure has been effected with the steppers A and B superposed one upon the other at the centers thereof is represented as follows from equations (4) and (5):

$$(\Delta X, \Delta Y) = (\Delta Xa, \Delta Ya) - (\Delta Xb, \Delta Yb) \quad (6)$$

From equation (6), the maximum values Dx, Dy and $\overline{D}$ of the absolute value of the difference $\Delta X$, the absolute value of the difference $\Delta Y$ and the scalar amount of the vector ($\Delta X$, $\Delta Y$) in the superposition exposure are (the projection field of view) are represented as follows:

$$Dx = MAX(|\Delta X|) \quad (7)$$

$$Dy = MAX(|\Delta Y|) \quad (8)$$

$$\overline{D} = MAX(\sqrt{\Delta X^2 + \Delta Y^2}) \quad (9)$$

Accordingly, if the magnification adjustment coefficients Ca and Cb are determined so that one of Dx, Dy and $\overline{D}$ is made smallest or that both of Dx and Dy are made smallest, the optimum condition will be obtained. Where magnification correction is effected by only the stepper B as in the present embodiment, the coefficient Ca may be zero. Accordingly, from equations (4), (5) and (6) above. The difference vector ($\Delta X$, $\Delta Y$) is represented as follows:

$$(\Delta X, \Delta Y) = \{fa(\sqrt{x^2 + y^2}) - fb(\sqrt{x^2 + y^2}) + (Ca - Cb)\sqrt{x^2 + y^2}\} \times \left(\frac{x}{\sqrt{x^2 + y^2}}, \frac{y}{\sqrt{x^2 + y^2}}\right) \quad (10)$$

(In the present embodiment, Ca=0.) Consequently, the main control device $CNT_2$ calculates the vector ($\Delta X$, $\Delta Y$) and the maximum values Dx, Dy and $\overline{D}$ while changing the adjustment coefficient Cb by the use of the pre-memorized distortion characteristics $DS_1$ (function fa) and $DS_2$ (function fb) with respect to each of a number of points in the projection exposure area, and finds out such a coefficient Cb that one of Dx, Dy and $\overline{D}$ or both of Dx and Dy are smallest, from the accuracy required of the superposition-exposed layer. The main control device $CNT_2$ puts out to the pressure adjuster $BC_2$ such a command value that corrects the magnification of the projection lens $PL_2$ by a value corresponding to the coefficient Cb. The pressure adjuster $BC_2$ controls the pressure while taking that command value into consideration together with the correction of the magnification fluctuation of the projection lens $PL_2$ caused by the irradiation history or the fluctuation of the atmospheric pressure.

Although the above-described analysis is such that a strict solution is obtained by a mathematical analysis in order to improve the matching accuracy in the entire exposure area, the solution can be obtained without so great an error even if only the distortion curve is used. So, the analysis using the distortion curve will now be described with reference to FIG. 8.

Figure 8:
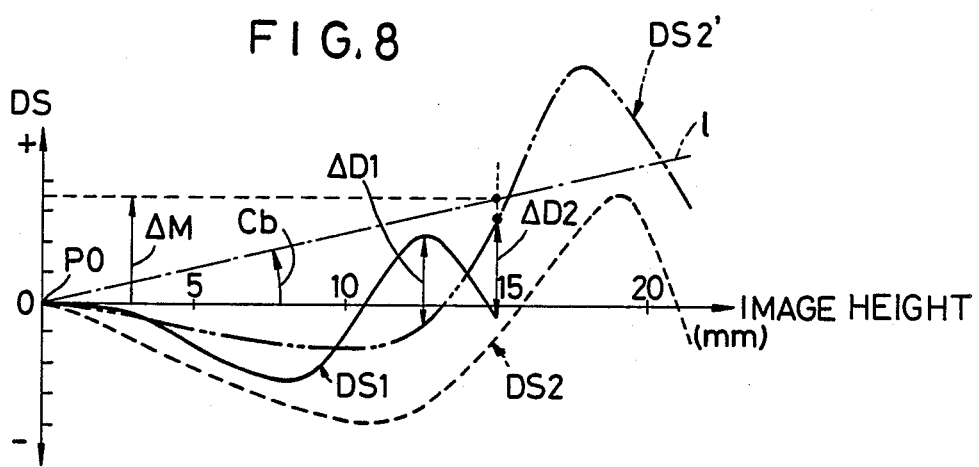
FIG. 8 is a graph when magnification adjustment is effected relative to the characteristics shown in FIG. 7.

FIG. 8 shows a state in which the distortion characteristics $DS_1$ and $DS_2$ have been superposed one upon the other with the magnification of the projection lens $PL_2$ being varied, and in this Figure, the distortion characteristic of the projection lens $PL_2$ after the adjustment of the magnification thereof is represented by $DS_2'$. First, the main control device $CNT_2$ calculates the difference between the amounts of distortion of the characteristics $DS_1$ and $DS_2$ before the adjustment of the magnification with respect to a number of points (for example, every 0.5 mm) between the center $P_0$ to the image height 15 mm, for example. Thereby, the maximum value of the absolute value of the difference $\Delta D$ is found as shown in FIG. 7. To make the absolute value of this difference $\Delta D$ small, as shown in FIG. 8, the magnification of the projection lens $PL_2$ may be corrected and the characteristic $DS_2$ may be inclined in the positive direction at a predetermined image height point. In FIG. 8, a straight line 1 passing through the center $P_0$ corresponds to the original image height axis of the characteristic $DS_2$, and the inclination Cb of the straight line 1 corresponds to the magnification adjustment coefficient C in equation (3). The main control device $CNT_2$ calculates the characteristic $DS_2'$ after the adjustment of the magnification on the basis of equation (3) with the inclination Cb being increased by a predetermined amount from zero. Again, the absolute value of the difference between the corrected characteristic $DS_2'$ and the characteristic $DS_1$ is calculated at each image height position, and the difference whose absolute value is greatest among them is found. The above-described operation is repeatedly effected with the inclination Cb being increased by a predetermined amount. Soon, as shown in FIG. 8, the difference $|\Delta D_1|$ near the position Px becomes smaller than $|\Delta D|$ in FIG. 7 and conversely the difference $|\Delta D_2|$ at another image height position becomes greater. In the case of the characteristics as shown in FIG. 8, the inclination Cb may be determined so that $|\Delta D_1| = |\Delta D_2|$. In the case of that inclination Cb, the amount of deviation $\Delta M$ from the image height axis of the straight line 1 obtained, for example, at a position of image height 15 mm in the amount of deviation caused by the magnification correction on the actual projected image plane.

The two distortion characteristics are thus compared with each other while the relative magnification is changed, and at each magnification, the maximum value of the difference (absolute value) between the amounts of distortion is found and such a magnification that makes the maximum value smallest is determined, whereby the best matching accuracy is obtained over the entire exposure area within an image height of 15 mm.

Figure 9:
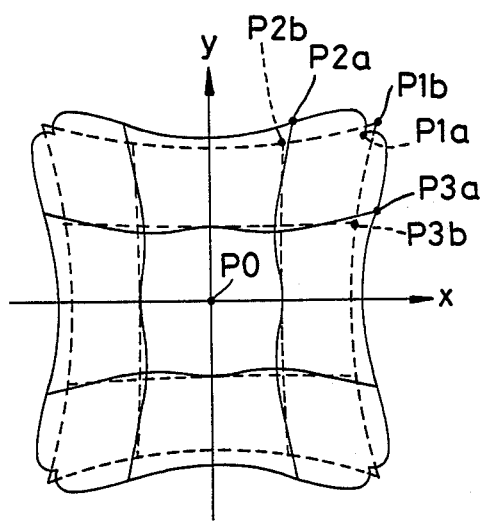
FIG. 9 is a chart exaggeratingly showing the deviation of the projected image of the ideal lattice point when superposition exposure is effected after magnification adjustment has been effected.

FIG. 9 shows an example of the matching state in a case where the magnification is adjusted in the manner described above and the superposition exposure by the stepper B is effected. In FIG. 9, solid lines indicate the superposition exposure by the stepper A and broken lines indicate the superposition exposure by the stepper B. It will be seen that as compared with the chart shown in FIG. 5, the amounts of deviation between the points of projection ($P_{1a}$ and $P_{1b}$, $P_{2a}$ and $P_{2b}$, $P_{3a}$ and $P_{3b}$) of the ideal lattice point are averagely small and the matching accuracy is improved.

Referring to FIG. 4, linear deformation (expansion or contraction) by heat or chemical treatment may sometimes occur to the wafer W subjected to the process E after the exposure in the stepper A. Accordingly, during the superposition exposure by the stepper B, it is desirable to effect magnification correction with said deformation being also taken into account. To that end, the amount of deformation can be found if the positions of alignment marks formed at a plurality of points on the wafer W are measured, for example, by an alignment device provided in the stepper B and each of those positions is compared with the design value.

Where the stepper A shown in FIG. 4 does not use the entire projection field of view of 20×20 mm as the exposure area or where it is desired to accurately adjust the absolute magnification of the exposure area of the wafer W as well, the magnification adjustment of the stepper A may also preferably be effected in advance with the superposition exposure by the stepper B being taken into account.

Figure 10:
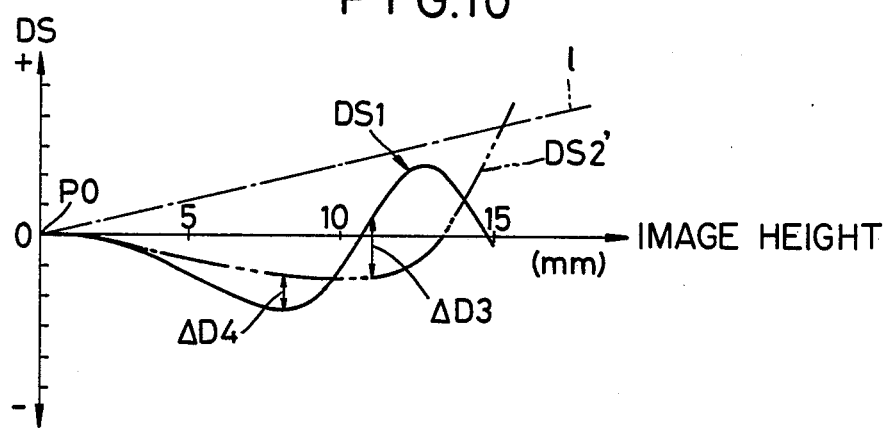
FIG. 10 is a graph when magnification adjustment is effected relative to the characteristics shown in FIG. 7.

Assuming that, for example, exposure is effected with the exposure area of the first layer by the stepper A being restricted to the size of image height 11 mm, if the magnification of only the stepper B is adjusted as in the previous embodiment, the degree of matching in the distortion characteristic will generally be biased in the negative direction as shown in FIG. 10. This will pose a serious problem when an attempt is made to control the absolute magnification on the wafer.

In FIG. 10, the image height positions at which the absolute value of the difference in amount of distortion between the characteristics $D_{S2'}$ and $DS_1$ are a point of about 8 mm and a point of about 11 mm, and if the absolute values of the differences $\Delta D_4$ and $\Delta D_3$ in the vicinity thereof are made equal to each other, the absolute value of the maximum amount of difference will be smallest. However, in the exposure area up to the image height of about 11 mm, the distortion during superposition is biased in the negative direction and therefore, if the characteristics $DS_1$ and $DS_2$ are inclined in the positive direction by the same value at a certain image height point, the distortion can be divided into the positive and negative in that exposure area.

FIG. 11 shows the characteristic during the optimum condition in which the difference has been made from the state of superposition as shown in FIG. 10 into $|\Delta D_3| = |\Delta D_4|$ and the distortion has been divided. In FIG. 11, straight line $l_2$ is the same as the straight line 1 in FIGS. 8 and 10, and straight line $l_1$ represents the original image height axis inclined by a coefficient Ca by the magnification adjustment of the stepper A, and characteristic $DS_1'$ represents the distortion of the projection lens $PL_1$ after the magnification adjustment.

To obtain such a characteristic, such a magnification adjustment coefficient Cb that the absolute values of the differences $\Delta D_3$ and $\Delta D_4$ are equal to each other is found with the characteristic $DS_2$ being inclined while the characteristic $DS_1$ remains fixed, that is, in the same manner as the previous embodiment. Thereafter, the inclinations of the straight lines $l_1$ and $l_2$ are varied by the same amount so that in the distortion characteristics superposed one upon the other, the maximum value of the positive amount of distortion and the maximum value of the negative amount of distortion are equal in absolute value to each other. The inclination Ca of the straight line $l_1$ found thereby is the magnification adjustment coefficient of the stepper A. Consequently, during the exposure of the first layer, use may be made with a magnification offset of $+\Delta Ma$ being applied to the stepper A, for example, at a point of image height 10 mm, and during the superposition exposure of the second layer, use may be made with a magnification offset of $+\Delta Mb$ being applied to the stepper B at a point of image height 10 mm. If such magnification correction is effected, not only the difference in the relative distortion between different layers decreases, but also the absolue amount of distortion (magnification error) of the pattern area formed on the wafer W can also be decreased.

In the above-described second embodiment, consideration has been given to the mix and match between steppers different in the size of the projection field of view. However, even between projection lenses identical in the size of the projection field of view, the distortion characteristics thereof usually become different, though slightly, due to the difference in lens construction, or to the error or irregularity of manufacture. So, example will now be described of the case where projection lenses are identical in the size of the projection field of view.

FIG. 12A shows the characteristic in which the distortion characteristic $DS_2$ of one of two steppers and the distortion characteristic $DS_3$ of the other stepper are superposed one upon the other without magnification adjustment being effected. Here, it is to be understood that the characteristic $DS_2$ is bad in distortion even in the same stepper and that the characteristic $DS_3$ is good in distortion. Assuming that such two steppers are used, for example, only in an exposure area of image height 16 mm, the absolute value of the difference in amount of distortion assumes a maximum vlaue $\Delta D$ near the imagae height 11 mm and further, the division of the distortion becomes more or less unbalanced. So, in such a case, if both of the characteristics $DS_2$ and $DS_3$ are inclined in the positive direction so that they may be $DS_2'$ and $DS_3'$ as shown in FIG. 12B, with the division of the distortion being also taken into account, there will be obtained the best matching accuracy. The characteristic $DS_2$ is varied as a characteristic $DS_2'$ by the magnification adjustment corresponding to the inclination of straight line $l_2$, and the characteristic $DS_3$ is varied as a characteristic $DS_3'$ by the magnification adjustment corresponding to the inclination of straight line $l_3$.

If this is done, the differences may be greatest at a point of image height 16 mm and a point in the vicinity of 8 mm, but by the maximum vlues of the absolute values of these differences having been made smallest, the difference in relative amount of distortion between the two steppers is made markedly smaller than in the case of FIG. 12A.

In each of the above-described embodiments, only the matching with respect to two steppers has been considered, but matching can likewise be carried out with respect to n steppers. In this case, by the use of the distortion characteristics of the n steppers, matching accuracy may be calculated by a computer of a higher rank, and the magnification of each stepper may be adjusted so that the best matching accuracy may be obtained over all the photolithography process of semiconductor element manufacture. Also, where the object (reticle) side of the projection lens is a non-telecentric optical system, the magnification can be adjusted also by finely adjusting the spacing between the reticle and the projection lens and thus, a similar effect is obtained. In this case, drive means for vertically moving the reticle stage holding the reticle by a minute amount along the optic axis is provided as magnification adjusting means.

Also, in the above-described embodiments, two distortion characteristics are compared with each other, for example, at every 0.5 mm on the image height axis to thereby find the maximum value of the absolute value of the difference. However, this is low in accuracy and involves some error for the true maximum value because the maximum value is found after the difference has been found at all image height points of every 0.5 mm with respect to a predetermined exposure range. Therefore, if the points compared are made finer than 0.5 mm, accuracy will be enhanced in its own way, but the operation processing time will increase in proportion thereto.

So, a method of quickly finding an accurate maximum value from two distortion curves by a mathematical analysis will be briefly described below.

Assuming that the distortion characteristics of the two steppers are $fa(\gamma)$ and $fb(\gamma)$, respectively, the distortion functions $Fa(\gamma)$ and $Fb(\gamma)$ taking the magnification adjustment coefficients Ca and Cb into consideration are as follows:

$$Fa(\gamma) = fa(\gamma) + Ca \cdot \gamma \tag{11}$$

$$Fb(\gamma) = fb(\gamma) + Cb \cdot \gamma \tag{12}$$

Here it is to be understood that the characteristics $fa(\gamma)$ and $fb(\gamma)$ are in the forms approximated by Na-order curve and Nb-order curve, respectively, and are stored in the main control devices of the respective steppers or the computer of a higher rank. The characteristics $fa(\gamma)$ and $fb(\gamma)$ are usually designed to be $fa(\gamma)=0$ and $fb(\gamma)=0$ when $\gamma=0$ so that the distortion characteristic of a projection lens of this type is rotation-symmetrical with respect to the optic axis and therefore, the general equation thereof is expressed as follows and there is no constant term therein.

$$f(\gamma) = K_n \cdot \gamma^n + K_{n-1} \cdot \gamma^{n-1} + \ldots + K_2 \cdot \gamma^2 + K_1 \cdot \gamma \tag{13}$$

where $K_n, K_{n-1}, \ldots, K_2$ and $K_1$ are constants. If the difference between the two distortion functions $Fa(\gamma)$ and $Fb(\gamma)$ is represented by a function $G(\gamma)$, the function $G(\gamma)$ is expressed as follows:

$$G(\gamma) = Fb(\gamma) - Fa(\gamma) \tag{14}$$
$$= fb(\gamma) - fa(\gamma) + (Cb - Ca) \cdot \gamma$$

Here, the function $G(\gamma)$ is differentiated by the image height $\gamma$ as follows in order to find the maximum point and minimum point of the function $G(\gamma)$ with C as $C = Cb - Ca$.

$$\frac{dG(\gamma)}{d\gamma} = \sum_{n=1}^{n=Nb} n \cdot Kbn \cdot \gamma^{n-1} - \sum_{n=1}^{n=Na} n \cdot Kan \cdot \gamma^{n-1} + C \quad (15)$$

where Kan represents the constant of the n-order term of the characteristic fa($\gamma$) and Kbn represents the constant of the n-order term of the characteristic fb($\gamma$).

Accordingly, if the image height $\gamma$ which satisfies $$\frac{dG(\gamma)}{d\gamma} = 0$$

is found, the maximum point and minimum point of the function G($\gamma$) can be known, and at one of those points, the absolute value of the difference becomes greatest. Where both of Na and Nb are of 3rd order or less, equation (15) becomes a quadratic equation and the solution can be analytically found, but where one of Na and Nb is of 4th order or more, the solution cannot be analytically found and thus, the solution is found by numerical calculation.

Now, assuming that the solution of the image height $\gamma$ which satisfies $$\frac{dG(\gamma)}{d\gamma} = 0$$

is $\gamma_1, \gamma_2, \ldots, \gamma_n$ and the maximum image height point in the exposure area is $\gamma_{max}$, these values are substituted into equation (14) to thereby calculate the values of G($\gamma$), G($\gamma_2$), ..., G($\gamma_n$), G($\gamma_{max}$). One of those calculated values which is greatest in absolute value is chosen, and assuming that this is Gmax, Gmax is expressed as follows:

$$Gmax = Max\{|G(\gamma_1)|, |G(\gamma_2)|, \ldots, |G(\gamma_n)|, |G(\gamma_{max})|\} \quad (16)$$

But those of $\gamma_1, \gamma_2, \ldots, \gamma_n$ which are greater than $\gamma_{max}$ or which assume negative values are exoluded from consideration. If this is done, the maximum value of the absolute value of the difference can be primarily found even if comparison is not done at evey 0.5 mm on the image height axis. The calculation as described above is repeatedly effected with the difference C(Cb—Ca) in relative magnification being changed by a minute amount, whereby optimum magnification adjustment coefficients Ca and Cb can be determined.

On the basis of the above-described technique, there will hereinafter be described an example of the case where both of Na and Nb are of the 3rd order. The characteristics fa($\gamma$) and fb($\gamma$) are determined as follows:

$$fa(\gamma) = Ka_3 \cdot \gamma^3 + Ka_2 \cdot \gamma^2 + Ka_1 \cdot \gamma \quad (17)$$

$$fb(\gamma) = Kb_3 \cdot \gamma^3 + Kb_2 \cdot \gamma^2 + Kb_1 \cdot \gamma \quad (18)$$

Consequently, the function G($\gamma$) of the difference between the functions Fa($\gamma$) and Fb($\gamma$) is represented as follows:

$$G(\gamma) = (Kb_3 - Ka_3) \cdot \gamma^3 + (Kb_2 - Ka_2) \cdot \gamma^2 + (Kb_1 - Ka_1) \cdot \gamma + (Cb - Ca) \cdot \gamma \quad (19)$$

If equation (19) is differentiated by $\gamma$, equation (20) will be obtained.

$$G'(\gamma) = 3(Kb_3 - Ka_3) \cdot \gamma^2 + 2(Kb_2 - Ka_2) \cdot \gamma + (Kb_1 - Ka_1) + (Cb - Ca) \quad (20)$$

If $Kb_3 - Ka_3 = K_3$ and $Kb_2 - Ka_2 = K_2$ and $Kb_1 - Ka_1 = K_1$ and $Cb - Ca = C$, the solution which satisfy $G'(\gamma) = 0$ are $\gamma_1$ and $\gamma_2$ as expressed in the following equations (21) and (22).

$$\gamma_1 = \frac{-K_2 + \sqrt{K_2^2 - 3K_3(K_1 + C)}}{3K_3} \quad (21)$$

$$\gamma_1 = \frac{-K_2 - \sqrt{K_2^2 - 3K_3(K_1 + C)}}{3K_3} \quad (22)$$

So, $\gamma_1$ and $\gamma_2$ are found by operating equations (21) and (22) with the value of C being changed by a minute amount, and further it is repeatedly executed to find the absolute values of G($\gamma_1$), G($\gamma_2$) and G($\gamma_{max}$) from equation (19). If, in this case. both of $\gamma_1$ and $\gamma_2$ are greater than $\gamma_{max}$ or assume negative values or are complex numbers, G($\gamma_{max}$) is the maximum value |Gmax| corresponding to the then value of C. Thus, the value of C corresponding to Gmax which is smallest of all the values of Gmax calculated each time the value of C is changed is the solution to be found. Consequently, Ca and Cb may be determined so as to satisfy that value of C.

A third embodiment of the present invention will now be described. In an exposure system disposed similarly to that of FIG. 4, the projection lens PL$_1$ of a stepper A has a reduction magnification of 1/2.5 and a maximum projection field of view of 30×30 mm (a circular field of diameter of about 42 mm) on a wafer, and the projection lens PL$_2$ of a stepper B has a reduction magnification of 1/10 and a maximum projection field of view of 10×10 mm (a circular field of diameter of about 14 mm) on the wafer. The pattern area PA$_1$ of a reticle R$_1$ is divided into four with its center as the origin as in FIG. 2A, and the same circuit pattern is formed in each quadrant. The size of the projected image of each quadrant on the wafer W is determined so as to coincide with the size of the exposed so as to coincide with the size of the exposed image of the stepper B on the wafer W.

The dimensional relation between the reticle R$_2$ and the reticle R$_1$ will now be described in detail. If the maximum dimensions of the pattern area PA$_2$ of the reticle R$_2$ are 100×100 mm and the dimensions of one shot by the stepper B are 10×10 mm, the dimensions of one shot by the stepper A will be twice, i.e., 20×20 mm. Therefore, the dimensions of the pattern area PA$_1$ of the reticle R$_1$ are 50×50 mm from the magnification of the projection lens PL$_1$. Four pattern areas of about 25×25 mm each exist within this square of 50×50 mm.

Data DS$_1$ and DS$_2$ regarding the distortion (image distortion) characteristics, etc. of the projection lenses PL$_1$ and PL$_2$ are mutually exchanged between main control devices CNT$_1$ and CNT$_2$. This may be done on-line between the main control devices CNT$_1$ and CNT$_2$, or may be done off-line through a magnetic disc or the like. The main control devices CNT$_1$ and CNT$_2$ also store therein the positioning information by the step-and-repeat system of stages ST$_1$ and ST$_2$, namely, the design data of the shot arrangement on the wafer W. A computer or the like is included in the main control devices $CNT_1$ and $CNT_2$ and performs an operation for correcting the actual stepping position by a minute amount or correcting the projection magnification by a minute amount, relative to the design shot arrangement, so that the matching accuracy by two exposure apparatuses may become best.

In the present embodiment, for simplicity of the ensuing description, it is assumed that the first layer on the wafer W is exposed by the stepper A and the superposition exposure of the second layer is effected by the stepper B and that the distortion of the projection lens $PL_2$ of the stepper B is ideally zero.

Figure 13:
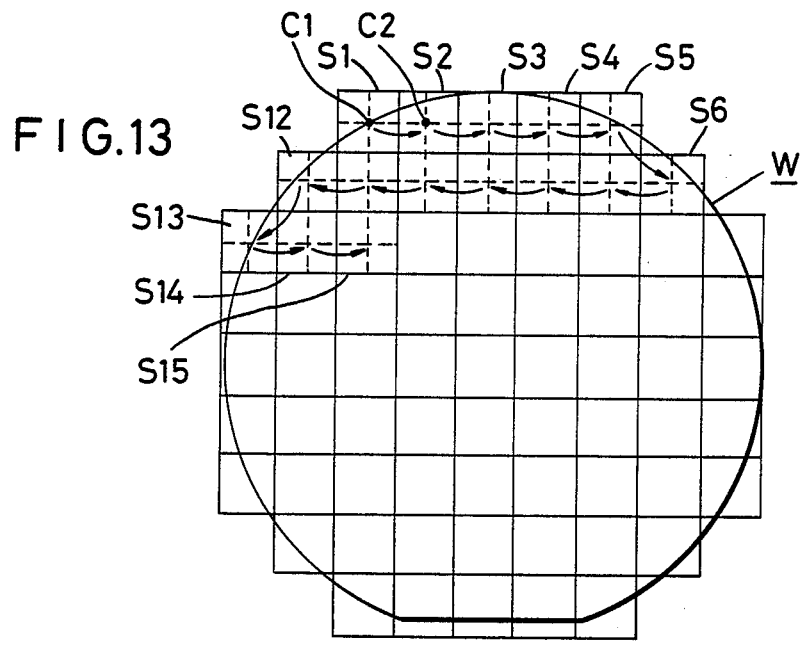
FIGS. 13 to 22 show a third embodiment of the present invention.

First, the wafer W is placed onto the stage $ST_1$ of the stepper A and on the basis of the design shot arrangement data, exposure of the first layer is effected by the step-and-repeat system. This state is shown in FIG. 13. FIG. 13 shows the arrangement of shots formed on the wafer W on the basis of the shot arrangement data stored in the main control device $CNT_1$. Each of the shots by the stepper A is represented by a solid-line square area and they are given reference characters $S_1$, $S_2$, $S_3$, ..., $S_6$, ..., $S_{15}$, respectively. The centers of the respective shots are designated by $C_1$, $C_2$, ..., respectively. The interior of each shot is divided by four identical circuit patterns shown in broken lines. The main control device $CNT_1$ stores therein the position information of the center $C_1$, $C_2$, ... of each shot as the shot arrangement data. The maximum projection field of view of the projection lens $PL_1$ is 30×30 mm on the wafer W and therefore, in the exposure of the reticle $R_1$, the size of a blind opening is adjusted by a reticle blind $BL_1$ so as to be a shot size of 20×20 mm on the wafer W so that only the pattern area $PA_1$ of the reticle $R_1$ is illuminated.

Figure 14:
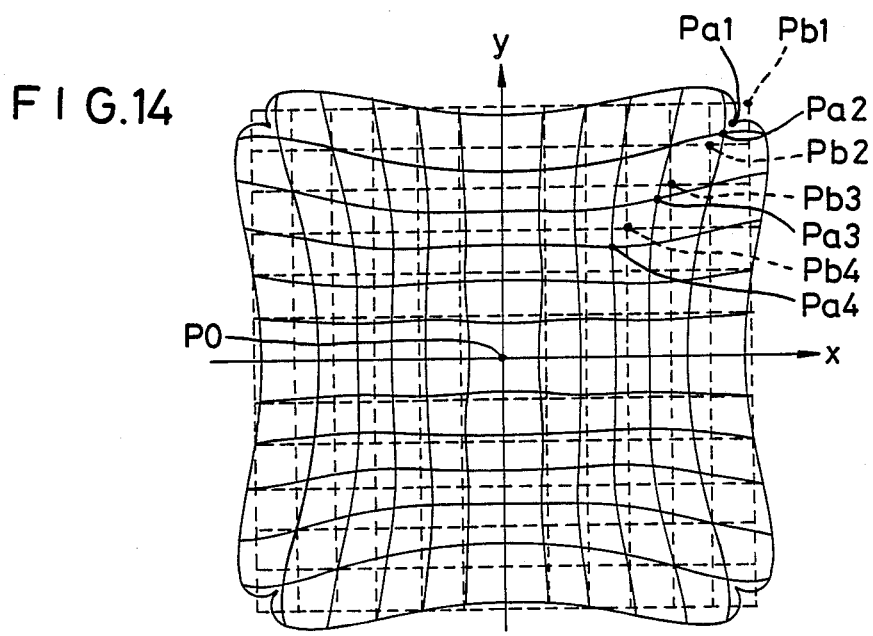

FIG. 14 is a projection chart of the ideal lattice points symbolically representing an example of the distortion characteristic of one shot formed on the wafer W in the manner described above. In FIG. 14, the points of intersection between equidistant straight lines indicated by broken lines parallel to the x-axis and y-axis of the orthogonal coordinate system xy are ideal lattice points, and the points of intersection between curved lines indicated by solid lines represent the projection points of the ideal lattice points. This chart shows the entire area of the maximum projection field of view of the projection lens $PL_1$. The origin $P_0$ of the coordinate system xy is determined so that the optic axis $AX_1$ of the projection lens $PL_1$ passes through it, and is also the center $C_1$, $C_2$, ... of each shot. As regards, for example, the first quadrant of the coordinate system xy, the projection points $Pa_1$, $Pa_2$, $Pa_3$ and $Pa_4$ of respective points shift substantially radially relative to the ideal lattice points $Pb_1$, $Pb_2$, $Pb_3$ and $Pb_4$ arranged in a radial direction of 45° from the origin $P_0$.

Now, the wafer W exposed with the distortion as described above is subjected to a process E, whereafter it is placed onto the stage $ST_2$ of the stepper B. The main control device $CNT_2$ of the stepper B stores therein such shot arrangement data that a square area indicated by broken line in FIG. 13 is one shot. Therefore, in the design, the stage $ST_2$ is caused to effect stepping in accordance with the shot arrangement data, whereby a pattern image for the second layer can be superposition-exposed on the first layer. However, if superposition is effected by the step-and-repeat system simply on the basis of the design value, the best matching accuracy may sometimes not be obtained due to the distortion of the stepper A even if the distortion of the stepper B is zero.

Figure 15:
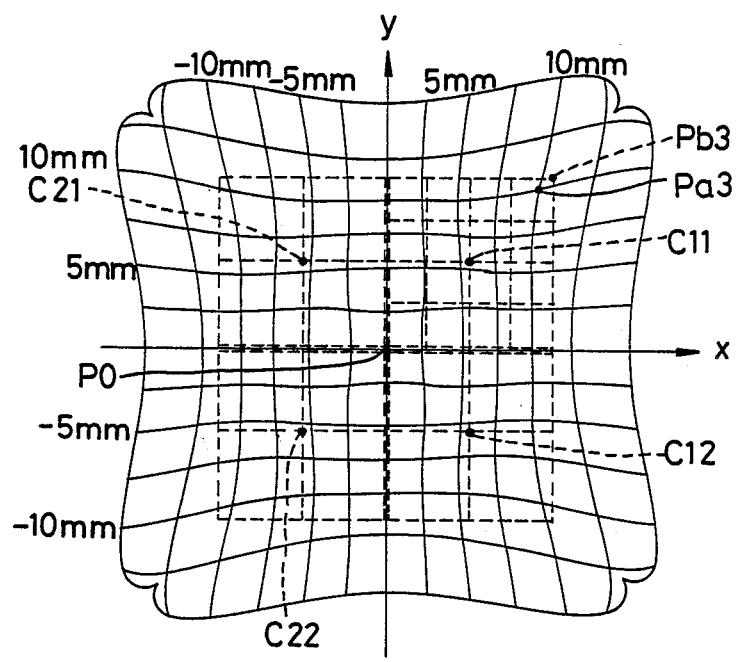

FIG. 15 is a chart symbolically showing the state of superposition in a case where step-and-repeat exposure has been effected by the stepper B as per the design value. The projection points of the ideal lattice points by the stepper A are indicated by solid lines, and the projection points of the ideal lattice points by the stepper B are indicated by broken lines. The manner in which the coordinate system xy is taken is the same as FIG. 14, and FIG. 15 shows the state in which the four shots of 10×10 mm each by the stepper B are put in about $C_{11}$, $C_{12}$, $C_{21}$ and $C_{22}$. It is assumed that the distortion of the stepper B is zero and thus, all of the four shots by the stepper B which are indicated by broken lines represent the ideal lattice points. In FIG. 15, as regards the shots in the first quadrant of the coordinate system xy, it is seen that the projected exposed image by the stepper B generally shifts away from the origin $P_0$ by a minute amount in a radial direction of 45° relative to the pattern area exposed by the stepper A. This shift is relative, but in the present embodiment, the large area has been exposed by previously using the stepper A and therefore, it is considered that the projected exposed image by the stepper B shifts with the pattern already formed on the wafer W as the reference. This amount of shift is due to the difference in distortion characteristic between two projection lenses, and in reality, it is a very small value (e.g. 0.2 μm or less). However, the shift is necessarily great at the point whereat the difference in distortion characteristic is greatest, and unsatisfactory matching may occur in a portion of the exposure area.

So, the main control device $CNT_2$ receives as an input from the main control device $CNT_1$ the data $DS_1$ regarding the distortion of the projection lens $PL_1$ and finds the optimum solution of the amount of shift from the design stepping position or the amount of magnification correction so as to minimize the matching error of the projected exposed image by the stepper B and the exposed area on the wafer W which is caused by the distortion. The distortion characteristic $DS_1$ of the projection lens $PL_1$ is stored in the main control device $CNT_1$ as a curve obtained by plotting the amount of distortion DS relative to the image height position, with respect to a number of image height points, as shown, for example, in FIG. 16. Applying this characteristic $DS_1$ so that an oblique straight line of 45° passing through the origin $P_0$, the center $C_{11}$ and the projection point $Pb_3$ on the first quadrant of the coordinate system xy in FIG. 15 is the image height axis, the amount of distortion at each point within the range up to the projection point $Pb_3$ becomes negative.

Figure 17:
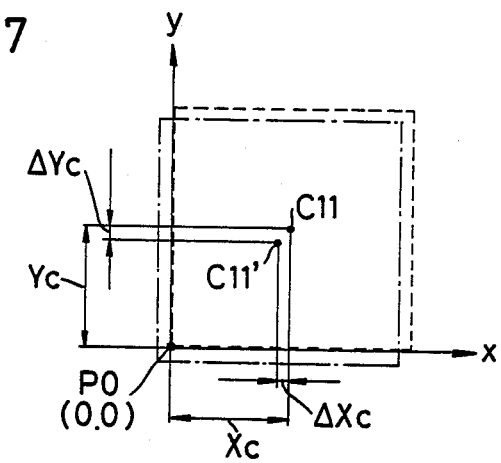

Let it be assumed that the projection exposure area by the stepper B is in the relation as shown in FIG. 17. In FIG. 17, the origin $P_0$ (0,0) of the coordinate system xy is the optic axis position of the stepper A and the square area indicated by broken line is the exposure area in a case where the stepper B has effected stepping as per the design value, and the center $C_{11}$ thereof is determined to the coordinate value (Xc, Yc) on the shot arrangement data. Also, the square area indicated by dot-and-dash line is the exposure area in a case where the wafer W is shifted by $-\Delta Xc$ and $\Delta Yc$ in x direction and y direction, respectively, from the design value, and the center $C_{11}'$, thereof is represented by a coordinate value (Xc−ΔXc, Yc−ΔYc). The amount of shift ΔXc, ΔYc in the amount of wafer position correction for obtaining the best matching accuracy.

Expressing the shifts of the exposed images by the steppers A and B from the ideal position in vectors (ΔAx, ΔAy) and (ΔBx, ΔBy) correspondingly to equation (3) used in the previous embodiment, the shift of the exposed image by the stepper A is represented by equation (23) and the shift of the exposed image by the stepper B is represented by equation (24). Here, it is to be understood that Xc'=Xc+ΔXc and Yc'=Yc+ΔYc.

$$(\Delta Ax, \Delta Ay) = \{fa(\sqrt{x^2 + y^2}) + Ca\sqrt{x^2 + y^2}\} \times \left(\frac{x}{\sqrt{x^2 + y^2}}, \frac{y}{\sqrt{x^2 + y^2}}\right) \quad (23)$$

$$(\Delta Bx, \Delta By) = \{fb(\sqrt{(x - Xc')^2 + (y - Yc')^2}) + Cb\sqrt{(x - Xc')^2 + (y - Yc')^2}\} \times \frac{x - Xc'}{\sqrt{(x - Xc')^2 + (y - Yc')^2}}, \frac{y - Yc'}{\sqrt{(x - Xc')^2 + (y - Yc')^2}} \quad (24)$$

where the function fa is the distortion curve of the stepper A, the function fb is the distortion curve of the stepper B, and Ca and Cb are the magnification adjustment coefficients of the steppers A and B, respectively. Where the distortion of the stepper B is regarded as zero as previously assumed, the term of the function fb in equation (24) is zero.

Now, from equations (23) and (24), the difference (Δx, Δy) between the distortions of the final superposed images is expressed as follows:

$$(\Delta x, \Delta y) = (\Delta Ax, \Delta Ay) - (\Delta Bx, \Delta By) \quad (25)$$

Further, from equation (25), the maximum value Dx of the absolute value of the difference Δx in the superposition exposure area, the maximum value Dy of the absolute value of the difference Δy and the maximum value $\bar{D}$ of the scalar amount of the vector (Δx, Δy) are expressed as follows:

$$Dx = MAx (|\Delta x|)$$

$$Dy = MAx (|\Delta y|)$$

$$\bar{D} = MAx (\sqrt{(\Delta x)^2 + (\Delta y)^2})$$

So, the computer in the main control device $CNT_2$ repeats operating the difference Δx, Δy and finding the maximum values Dx, Dy and D while changing the amounts of ΔXc and ΔYc little by little with respect to a number of points in the projection exposure area by the stepper B, and determines such amounts of shift ΔXc and ΔYc that minimizes one of Dx, Dy and D, or minimizes the greater one of Dx and Dy, or makes both of Dx and Dy as small as possible. At this time, it is possible to find the optimum solutions of the magnification adjustment coefficients Ca and Cb at a time, but in the present embodiment, it is to be understood that both of Ca and Cb are fixed to initial values (zero) and the above-described operation is effected to find only the amount of shift and then Ca and Cb are determined.

Figure 16:
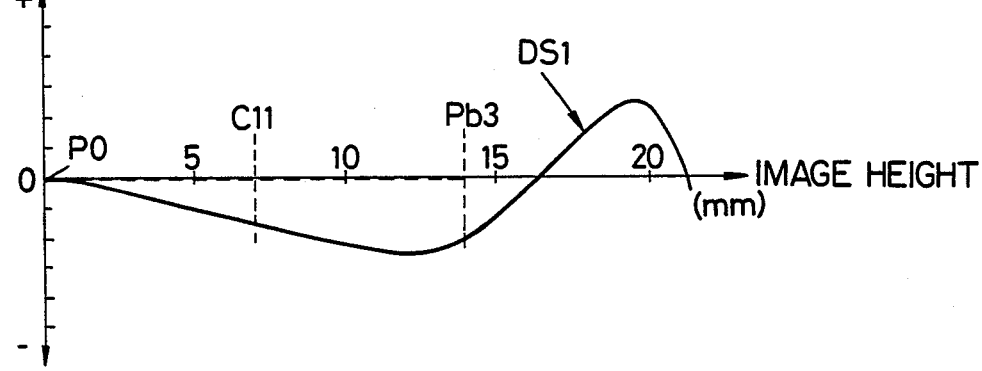

By this operation, in the present embodiment, there is obtained from the characteristic DS1 shown in FIG. 16 such a solution that within one shot exposed by the stepper A, it is best to shift the four shots exposed by the stepper B by a minute amount toward the origin $P_0$, as is apparent from FIG. 15. The state of a case where superposition exposure is accomplished by this shift is shown in FIG. 18.

Figure 18:
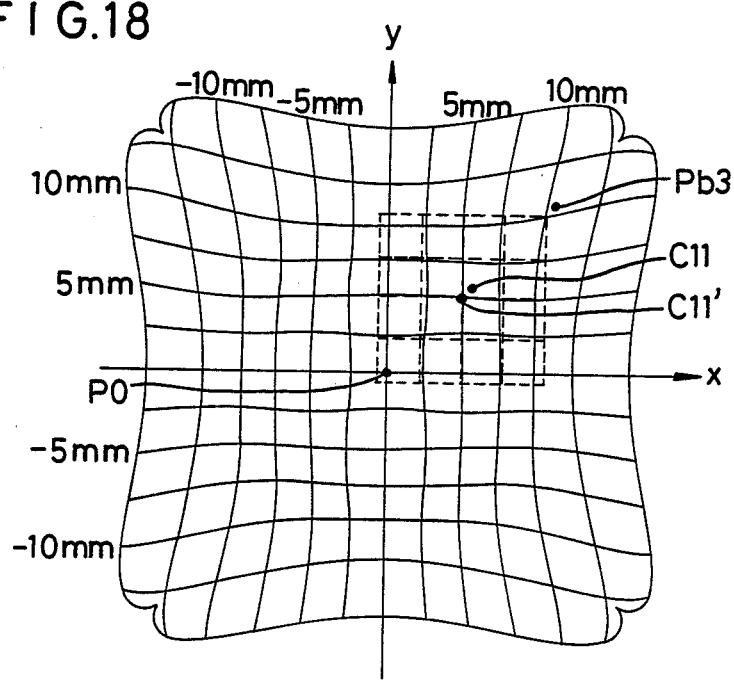

FIG. 18 is the same chart as FIG. 15 and it shows only the exposed image of the stepper B in the first quadrant of the coordinate system xy. In FIG. 18, C11 and C11' are identical to the centers shown in FIG. 17. It is seen that as compared with the state of FIG. 15, the exposed image of the stepper 13 and the exposed area formed on the wafer W by the stepper A are generally improved in matching accuracy.

The exposure area by the stepper B protrudes into the adjacent second and fourth quadrants, but on the wafer W, street (scribe) lines of a width of 20–100 μm are usually formed on the x- and the y-axis and moreover the amount of shift is 1 μm or less and therefore, the actual pattern area does not protrude into the pattern areas in the adjacent quadrants.

Figure 19:
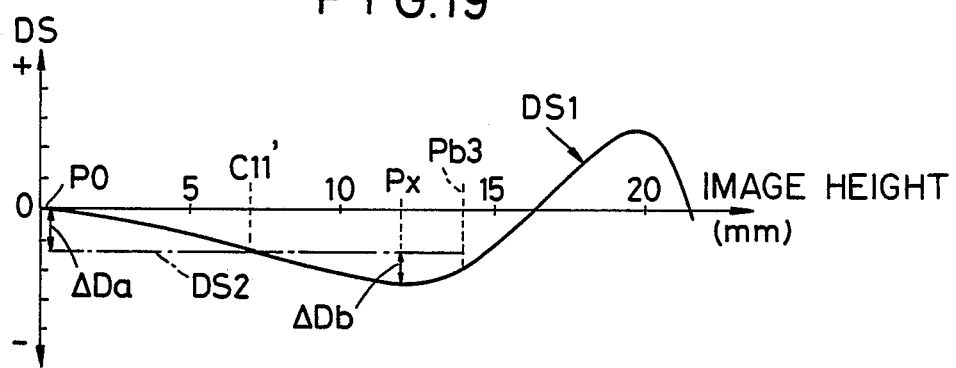

FIG. 19 is a graph representing the state of FIG. 18 in distortion characteristic. Distortion characteristic $DS_2$ represents that of the projection lens $PL_2$ of the stepper B and in the present embodiment, it is assumed that the distortion of the projection lens $PL_2$ is ideally zero and therefore, the characteristic $DS_2$ is represented by a straight line parallel to the image height axis. In this Figure, the deviation between the characteristic $DS_2$ and the image height axis corresponds to the previously described amount of shift.

Figure 20:
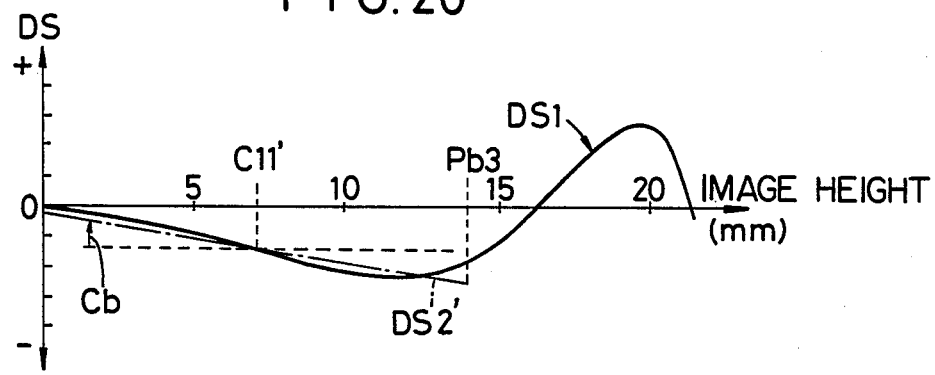

As is apparent from FIG. 19, substantially at the center C11' in the exposure range from the origin $P_0$ to a point $Pb_3$, the difference in amount of distortion between the distortion characteristics $DS_1$ and $DS_2$ is zero, and about the center C11', the relative difference in amount of distortion is substantially equally divided vertically with $DS_2$ as the reference. That is, in the case of FIG. 19, the difference ΔDa between the two characteristics at the left of the center C11' may be greatest at the origin $P_0$, and the difference ΔDb at the right of the center C11' may be greatest near the image height Px. By the previous operation, the amount of shift of the characteristic $DS_2$ is determined so that the absolute value of ΔDa is equal to the absolute value of ΔDb. Next, from the two characteristics $DS_1$ and $DS_2$ determined as shown in FIG. 19, such a solution that the best matching accuracy is obtained is found by adjusting the projection magnification of the projection lens $PL_2$ of the stepper B. Here, the determined amounts of shift ΔXc and ΔYc are substituted into equations (2)–(7) and further, with Ca as Ca=0, the maximum values Dx, Dy and $\bar{D}$ of the absolute values are operated while Cb is changed little by little, whereby such Cb that one of Dx, Dy and $\bar{D}$ or both of Dx and Dy are smallest or both of Dx and Dy are as small as possible is determined. When the magnification adjustment coefficient Cb is changed here, the characteristic $DS_2$ becomes a characteristic $DS_2'$ inclined about C11' as shown in FIG. 20, with the distortion characteristic $DS_1$ as the reference. The amount of inclination of the characteristic $DS_2'$ corresponds to the magnification adjustment coefficient Cb. Accordingly, the main control device $CNT_2$ finds the difference between the characteristics $DS_1$ and $DS_2'$ at every minute interval (e.g. 0.5 mm) on the image height axis while changing the coefficient cb, and finds out one of the absolute values of those differences which is the maximum value.

Such a coefficient Cb that the maximum value is smallest is found at a plurality of image height points up to the exposure range $Pb_3$. Thereafter, the main control device $CNT_2$ controls the pressure adjuster $BC_2$ on the basis of the determined coefficient Cb and obtains a characteristic $DS_2'$. The image of the projected pattern area $PA_2$ becomes slightly shrunk relative to the design dimensions thereof.

Figure 21:
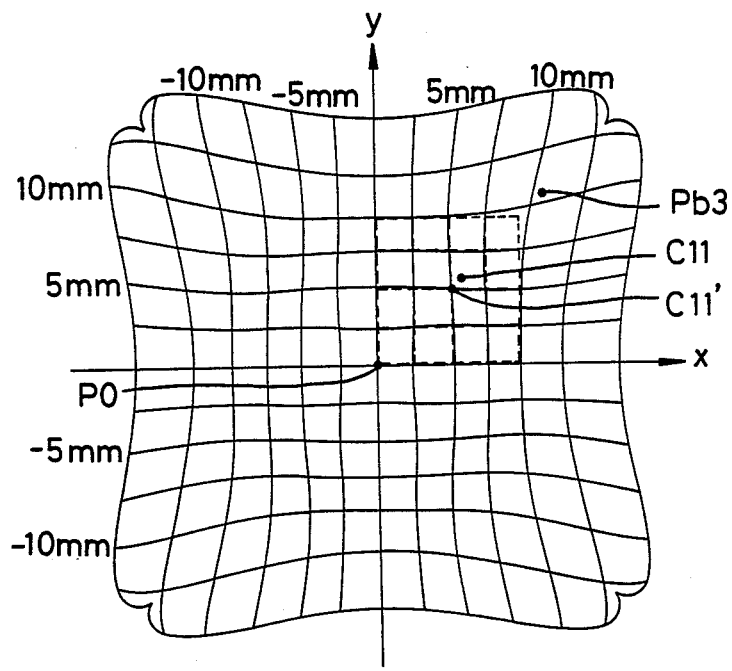
Figure 22:
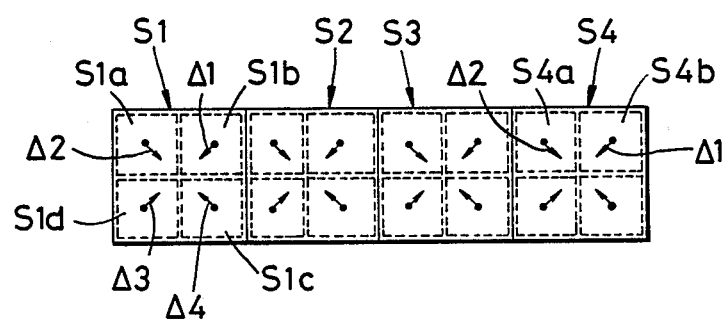

When superposition exposure is effected with the magnification of the stepper B being thus adjusted, the matching accuracy thereof is markedly improved as shown in FIG. 21. Generally, the distortion characteristic of the projection lens of this type is point-symmetrical with respect to the optic axis and therefore, with regard to the second, third and fourth quadrants as well, the magnification of the stepper B may be adjusted by the same amount. Assuming that the directions and amounts of shift of the respective quadrants are expressed in vectors $\Delta_1$, $\Delta_2$, $\Delta_3$ and $\Delta_4$, the main control device $CNT_2$ corrects, during the actual exposure of the step-and-repeat type, the shot position determined by the design shot arrangement data by one of the vectors $\Delta_1$, $\Delta_2$, $\Delta_3$ and $\Delta_4$. This state is shown in FIG. 22. The shot areas by the stepper A are $S_1$, $S_2$, $S_3$ and $S_4$, and with regard to $S_1$, the shot areas by the stepper B are $S_1a$, $S_1b$, $S_1c$ and $S_1d$. Assuming that the stepper B exposes the upper row of the shot areas $S_1$, $S_2$, $S_3$ and $S_4$ in succession from left to right, stepping is effected with the position corrections of vectors $\Delta_2$, $\Delta_1$, $\Delta_2$ and $\Delta_1$ being involved for the shots $S_1a$, $S_1b$, $S_4a$ and $S_4b$, respectively. Of course, the projection magnification is adjusted on the basis of the determined coefficient Cb before the exposure operation is entered.

Conversely to the present embodiment, the exposure may be affected by the stepper B and then by the stepper A. In that case, the magnification of the stepper B may be adjusted in advance and the shot position may be corrected from the design position and exposure may simply be effected, whereby a similar effect may be obtained. As the method of adjusting the projection magnification, where the object (reticle) side of the projection lens is a non-telecentric optical system, the optical spacing (the optical path length) between the reticle and the projection lens may be made variable.

Figure 23:
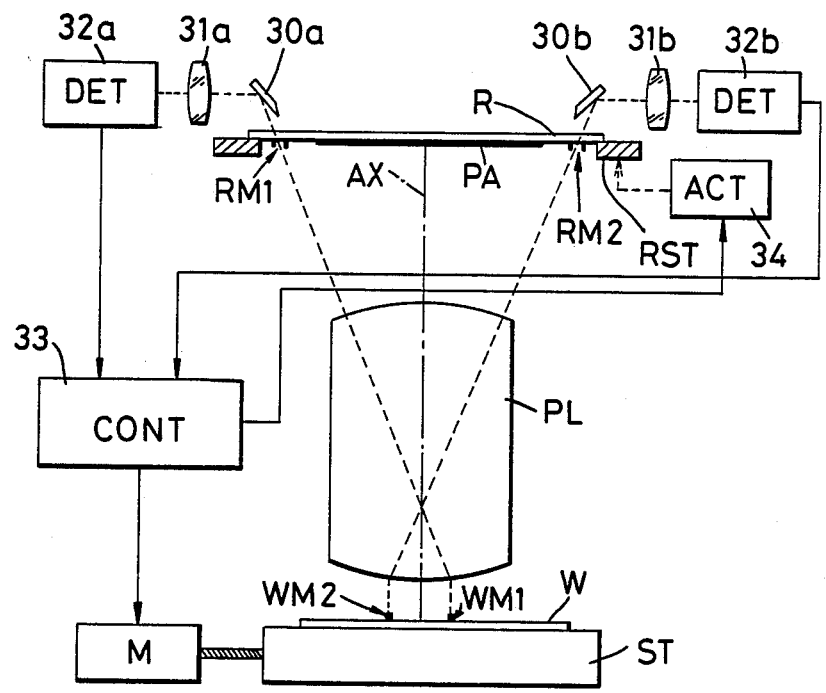
FIG. 23 shows the construction of a stepper suitable for a fourth embodiment of the present invention.
Figure 24:
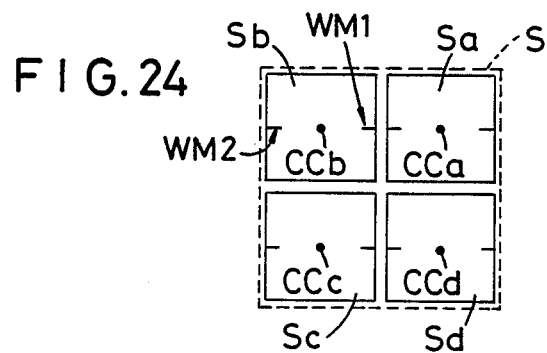
FIG. 24 is a plan view showing the shot arrangement and alignment marks on a wafer placed on the stepper of FIG. 23.

An exposure method according to a fourth embodiment of the present invention will now be described with reference to FIGS. 23 and 24. FIG. 23 schematically shows the construction of a stepper suitable for carrying out the present method. This stepper is used to effect superposition exposure on a pattern preformed on a wafer W, and unlike the previous embodiment, it accomplishes relative shift of the exposed area on the wafer W and the projected image by finely moving a reticle R. The reticle R is held on a reticle stage RST which is finely movable at least in x direction and y direction. Around the pattern area PA of the reticle R, there are formed marks RM1 and RM2 for the alignment with the wafer W. On the other hand, on the wafer W held on a stage ST, there are formed marks WM1 and WM2 which can be superposed upon the marks $RM_1$ and $RM_2$. The manners in which the converse projected images of the marks $WM_1$ and $WM_2$ by a projection lens PL are superposed upon the marks $RM_1$ and $RM_2$, respectively, are detected by respective alignment sensors comprising mirrors 30a, 30b, objectives 31a, 31b and positional deviation detecting portions 32a, 32b each including a photoelectric converter. A main control device 33 receives as an input the information corresponding to the amount of relative positional deviation between the marks RM and WM detected by the two alignment sensors, and controls a drive motor M for the step and repeat of the stage ST so that the positional deviation becomes zero. Of course, the main control device 33 controls the reticle stage RST also so as to shift the reticle R before the exposure as required in order to improve the matching accuracy.

On the wafer W, four exposed areas Sa, Sb, Sc and Sd are preformed as a shot S during the previous exposure process. In each of the four areas Sa, Sb, Sc and Sd within this shot S, marks $WM_1$ and $WM_2$ are formed at predetermined positions.

The actual superposition exposure is operated in the following manner. The stage ST is caused to effect stepping in accordance with the shot arrangement data stored in the main control device 33 and is positioned so that the optic axis AX of the projection lens PL substantially coincides, for example, with the center CCa of the area Sa. Subsequently, the operation shifts to the alignment in which the two-dimensional deviation between the marks $RM_1$ and $WM_1$ and the two-dimensional deviation between the marks $RM_2$ and $WM_2$ are detected by the two alignment sensors (the so-called die-by-die alignment). The usual die-by-die alignment is terminated simply by finely moving the wafer W two-dimensionally so that the marks $RM_1$ and $WM_1$ and the marks $RM_2$ and $WM_2$ are in a positional relation predetermined in the design. In the present embodiment, however, in order to obtain the same action as the shift shown in FIG. 18, an actuator 34 is controlled so that the position of the reticle R is further shifted.

When the reticle R is thus moved, there is the possibility that the positioning accuracy is improved more than when the wafer W is moved as in the previous embodiment. This is because if the reduction rate of the projection lens PL is 1/10, the pattern area PA of the reticle is in a relation in which it is enlarged to ten times relative to the area Sa on the wafer w. Of course, this also holds true in a case where the other areas Sb, Sc and Sd are exposed, but the directions of shift of the central point of the pattern area PA relative to the centers CCb, CCc and CCd of the respective areas differ from one another as shown in FIG. 22.

In the present embodiment, as described above, the reticle is finely moved when the die-by-die alignment is effected, and the amount of shift for reducing the difference in distortion is taken into account and therefore, the matching accuracy can be improved without reducing the throughput. Where the reticle is to be finely moved as in the present embodiment, the die-by-die alignment need not always be effected by the use of the alignment sensors. For example, where the position of the stage ST is measured by a laser interference measuring machine, the optic axis AX of the projection lens PL and the center CC of each area Sa, Sb, Sc, Sd can be positioned within a range sufficiently smaller than the amount of shift. Accordingly, an encoder or a laser interference measuring machine for precisely reading the amount of movement of the reticle stage RST from a predetermined initial position (the design position) may be provided so that the movement of the reticle stage RST may be servo-controlled by one the measured valuⓇthereof.

Where the reticle is shifted as in the present embodiment, the projected pattern image itself may be of an asymmetrically distorted shape, but such direction and amount of shift that the best matching accuracy, including said asymmetry, is obtained can be found by repeating the operation of the previously described third embodiment.

A fifth embodiment of the present invention will now be described. In the present embodiment, description will be made of a case where the dimension of a side (or a diagonal) of the projection exposure areas (shots) of two steppers used for mix and match is not in integer times relation. Again in the present embodiment, one or both of the shift of the wafer and the shift of the reticle can be effected, but here, for simplicity of description, only the shift of the wafer will be described.

It is to be understood that the projection lens $PL_1$ of the stepper A is of a reduction rate of 1/2.5 and its maximum projection area is 30×30 mm, and that the projection lens $PL_2$ of the stepper B is of a reduction rate of 1/5 and its maximum projection area is 20×20 mm. It is also to be understood that as an example, the projected pattern image of the reticle $R_1$ by the stepper A is used over 24×24 mm and the projected pattern image of the reticle $R_2$ by the stepper B is used over 16×16 mm.

Figure 25A:
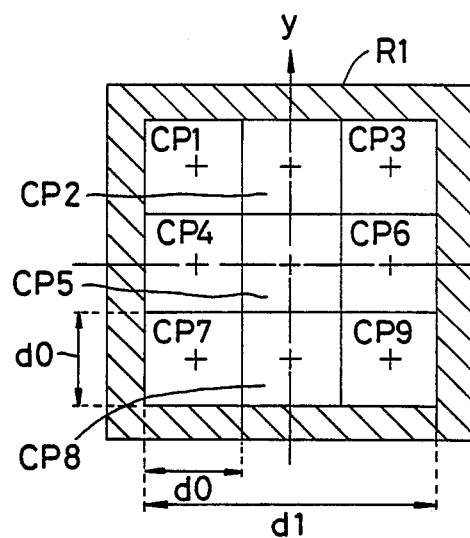
FIGS. 25A and 25B are plan views showing the chip arrangements of two reticles, respectively, used as a fifth embodiment of the present invention.
Figure 25B:
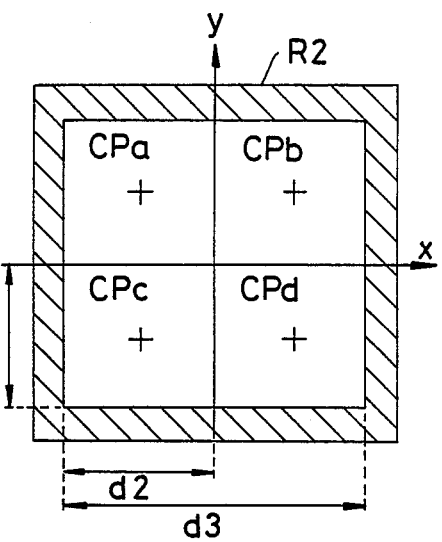

FIG. 25A shows the chip arrangement of the reticle $R_1$. Nine square chip patterns $CP_1$–$CP_9$ each having each side of dimension $d_0$ are arranged in the form of a matrix. Therefore the exposure area (pattern area) on the reticle $R_1$ is a square area having each side of dimension $d_1$. The reticle $R_1$ is positioned so that the optic axis $AX_1$ of the projection lens $PL_1$ passes through the center of the pattern area (the origin of the coordinate system xy). Thus, the dimensions of the exposed image of one shot on the wafer are a square of $d_1/2.5$ (=24 mm). On the other hand, FIG. 25B shows the chip arrangement of the reticle $R_2$. Four square chip patterns CPa, CPb, CPc and CPd each having each side of dimension $d_2$ are arranged in the respective quadrants of the coordinate system xy. Therefore the pattern area on the reticle $R_2$ is a square area having each side of dimension $d_3$. Thus, the dimensions of the exposed image of one shot on the wafer are a square of $d_3/5$ (=16 mm). Further on the wafer, the dimensions of the exposed images of the chip patterns $CP_1$–$CP_9$ and the dimensions of the exposed images of the chip patterns CPa–CPd are determined so as to be coincident with one another.

Figure 26:
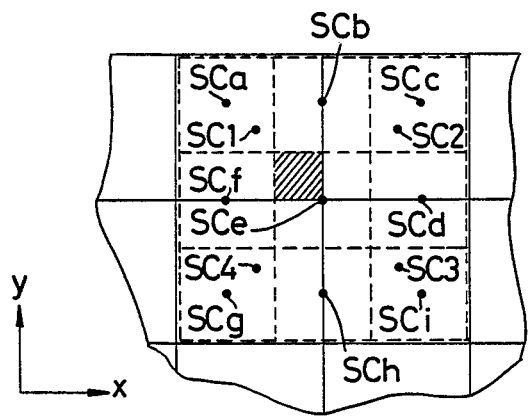
FIG. 26 is a plan view showing the shot arrangement on the wafer.

When the pattern of the reticle $R_1$ is to be transferred onto the wafer by the stepper A and thereafter the pattern of the reticle $R_2$ is to be superposedly transferred onto the wafer by the stepper B, the shot arrangement of the two steppers on the wafer is determined as shown in FIG. 26. The shot centers by the stepper A are $SC_1$, $SC_2$, $SC_3$ and $SC_4$ and the shot areas thereof are indicated by solid lines, and the shot centers by the stepper B are SCa, SCb, SCc, SCe, SCf, SCg, SCh and SCi and the shot areas thereof are indicated by broken lines. The four shots SCa, SCc, SCg and SCi by the stepper B are included in the shots $SC_1$, $SC_2$, $SC_3$ and $SC_4$, respectively, by the stepper A.

Also, the four shots SCb, SCd, SCf and SCh by the stepper B are arranged equally astride the two shots by the stepper A. Further, the one shot SCe by the stepper B is arranged equally astride the four shots by the stepper A. The square area indicated by hatching in FIG. 26 corresponds to one chip pattern (here, the projected image of $CP_1$ or CPd). When the exposed image to be superposition-exposed is thus astride a plurality of shots during the previous step, it is necessary to apply some limitation to the direction of shift of the wafer with the manner of being astride taken into consideration.

So, the state in which the one shot by the stepper B is included in the one shot by the stepper A will first be described with reference to FIG. 27. In FIG. 27, the chart indicated by broken lines exaggeratingly represents the distortion of the projected image (24×24 mm) of the ideal lattice point by the stepper A, and the chart indicated by solid lines exaggeratingly represents the distortion of the projected image (16×16 mm) of the ideal lattice point by the stepper B. This state of superposition is a case where the steppers A and B have been caused to effect stepping as per the design and in this state, the shot center $SC_1$ of the stepper A is made coincident with the origin of the coordinate system xy. In this state, the shot center SCa of the stepper B greatly deviates from a point SCa' corresponding to the center SCa in the exposed image by the stepper A, and also the lattice points generally deviate from each other.

So, with respect to the area in which the shot of the stepper B and the shot of the stepper A overlap each other, such direction and amount of shift that the matching accuracy becomes best are found as in the previously described embodiment. As a result, when the actual shot center SCa is shifted from the design shot position SCa'' by the stepper B so as to become substantially coincident with a point SCa' as shown in FIG. 28, the matching accuracy becomes best.

A case where the one shot by the stepper B is astride the two shots by the stepper A will now be considered. For example, in FIG. 26, the shot centered at SCb is equally astride the two shots during the previous step which are arranged in x direction on the wafer. In this case, when the shot center SCb is shifted in x direction from the design position (on the center line of the boundary between two shots on the wafer), the matching accuracy is degraded substantially as compared with that before said shot center is shifted. Accordingly, in such a case, the shot center SCb may be shifted only in y direction and as regards the amount of shift for obtaining the best matching accuracy, the maximum value of the absolute value of the difference between two distortion characteristics may be found with the amount of shift being changed little by little with respect only to y direction on the basis of the previous operation equations, whereby the amount of shift when the maximum value is smallest may be found.

A state in which the one shot SCe by the stepper B is equally astride the four shots by the stepper A will now be considered. In this case, when the shot center SCe is shifted from the design position, the matching accuracy is improved with respect, for example, to the superposition area lying in a direction shifted from the center SCe, but the matching accuracy is reduced with respect to the superposition area lying in the direction opposite to the shifted direction. Therefore, the shot center SCe need not be shifted from the design position.

Figure 29:
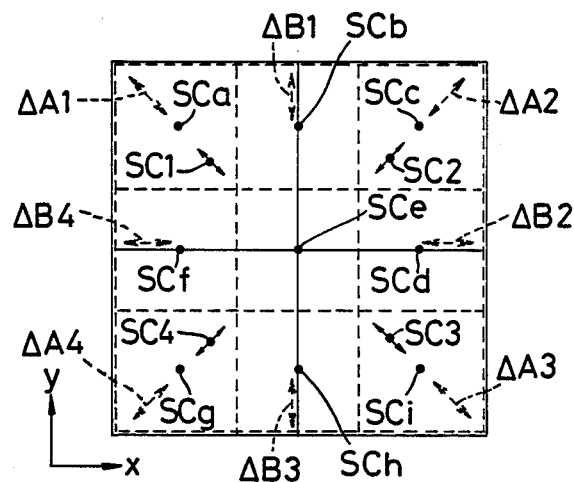
FIG. 29 is a map schematically showing the direction of shift corresponding to the shot position.

So, putting the above-described states in order, a map in the directions of shift as shown in FIG. 29 can be made. Directions of shift $\Delta A_1$, $\Delta A_2$, $\Delta A_4$ and $\Delta A_3$ corresponding to the shot centers SCa, SCc, SCg and SCi and directions of shift $\Delta B_1$, $\Delta B_2$, $\Delta B_3$ and $\Delta B_4$ corresponding to the shot centers SCb, SCd, SCf and SCh are shown. Shift is not effected with respect to the shot center SCe.

Also, if as described in connection with FIG. 17, the shot centers $SC_1$, $SC_2$, $SC_3$ and $SC_4$ by the stepper A are arranged while being shifted by a minute amount from the design shot position in the direction of the point of intersection (coincident with the shot center SCe) between the four shots by the stepper A as indicated by arrows in FIG. 29, the matching accuracy may be further improved.

Figure 30:
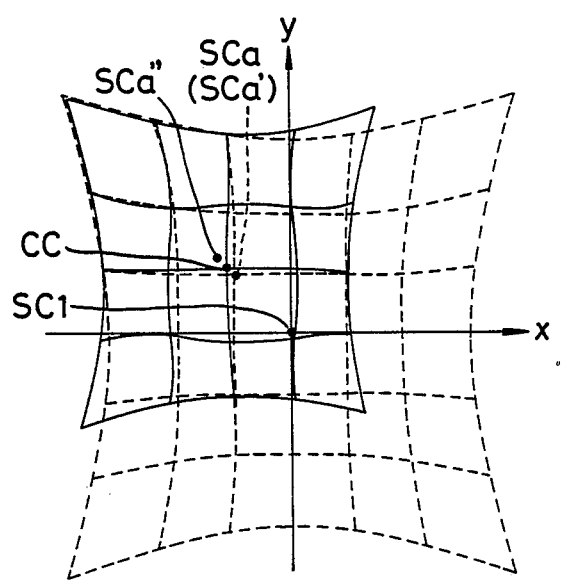
FIG. 30 is a chart showing the state of matching when the reticle is shifted from the state of FIG. 28.

Again in the case of the present embodiment, the matching accuracy can be further improved by finely adjusting the magnification of the stepper B or the stepper A. The shifts indicated by arrows in FIG. 29 include the shifting of the reticle by a minute amount, as in the embodiment of FIGS. 23 and 24. So, the state of superposition in a case where the reticle is further shifted from the state of FIG. 28 is shown in FIG. 30. In this case, the center of the reticle $R_2$ is slightly shifted from the projection optic axis $AX_2$ of the stepper B and thus, the projected image by the stepper B becomes asymmetrically distorted, but the area on the wafer to be superposition-exposed also involves asymmetrical distortion and therefore, as a result, the matching accuracy is improved. In FIG. 30, SCa" is the position of the design shot center by the stepper B (in a case where both of the shifts of the wafer and reticle are zero), and SCa (SCa') is the position of the shot center when only the wafer is shifted (a point at which the shift of the reticle is zero and which coincides with the optic axis $AX_2$). CC is the position of the center of the pattern area when the reticle $R_2$ is further shifted, and it deviates leftwardly upwardly by a slight amount from the point SCa (or SCa') through which the optic axis $AX_2$ passes. It is seen that as compared with FIG. 28, the matching accuracy is further improved in the marginal portion of the superposition exposure area by the stepper B.

Figure 31:
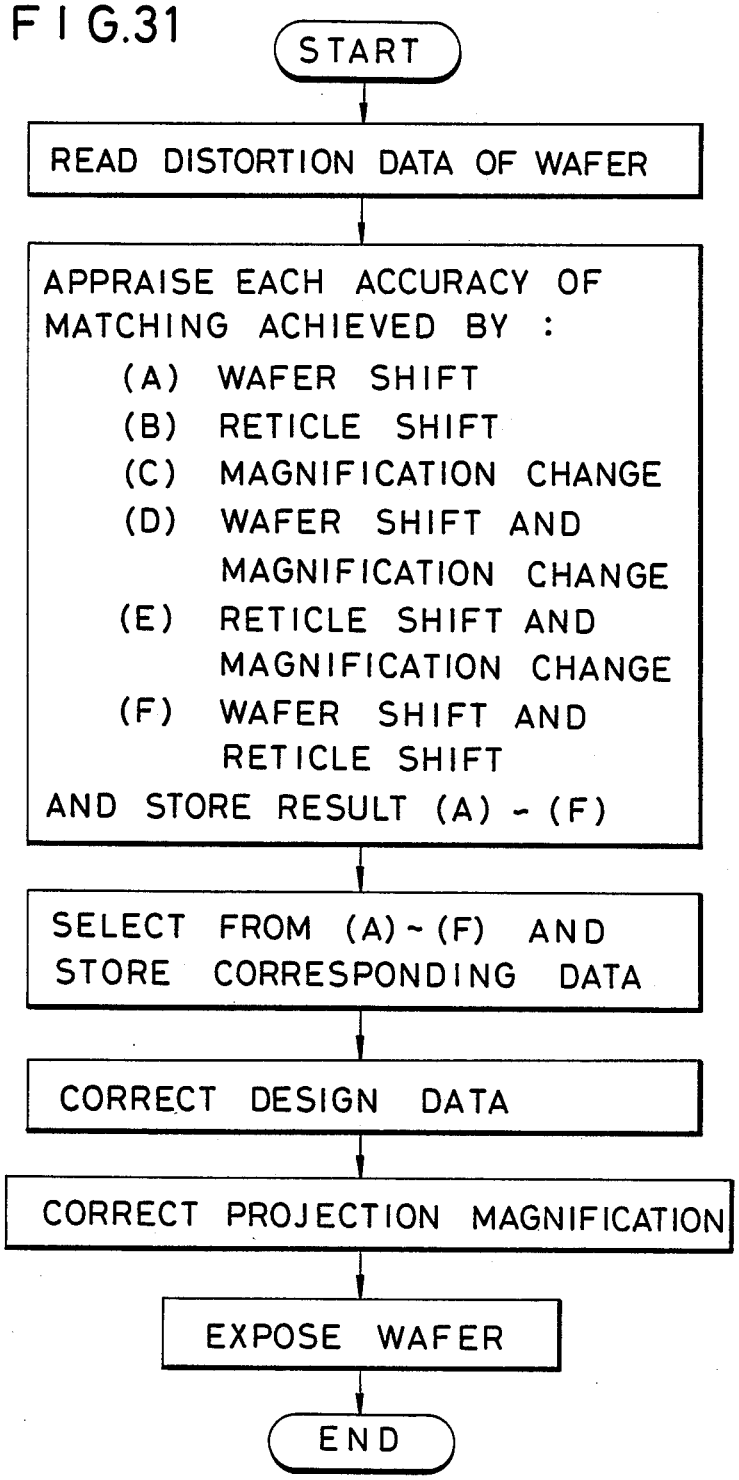
FIG. 31. is a flow chart showing the processing procedure of a system in which various shifts according to a sixth embodiment of the present invention are combined together.

An exposure method designed so as to simulate the hitherto described shift of the wafer, shift of the reticle and method of improving the matching accuracy by magnification adjustment, by changing the combination thereof and selecting those whereby the best matching accuracy is obtained is shown in FIG. 31.

First, the distortion data of the exposed area on the wafer to be superposition-exposed is read into the main control device CNT or the computer of a higher rank for concentrated control. At this time, the data of the linear deformation of the wafer by a heat treatment or a chemical treatment applied to the wafer is also read in a the distortion data. This linear deformation can be actually measured by the use of conventional wafer alignment sensors provided on the steppers. More specifically, the positions of alignment marks formed at a plurality of designed locations on the wafer for the alignment of the wafer are measured by the use of the wafer alignment sensors and the deviation between the measured values and the design value is found, whereby the linear deformation (run out) is detected. The amount of this deformation differs delicately depending on the shot position on the wafer, and generally, the amount of deformation is zero at the central portion of the wafer and the amount of deformation in the radial direction increases toward the marginal portion of the wafer. The distortion data by this linear deformation, together with the shift for the improvement of the matching accuracy taking the distortion of the projection lens into account, is used as the amount of shift of the stepping position of the stage ST during the step-and-repeat exposure.

Subsequently, such direction and amount of shift of the wafer that the best matching accuracy is obtained are found by simulation while the wafer is shifted by a slight amount in various directions from the design stepping position by the use of the distortion data of the exposed area on the wafer (the projection field of view of the projection optical system of the exposure apparatus used in the previous step) and the distortion data of the projection lens of the stepper which effects superposition-exposure. The result (A) of the then evaluation, for example, the $\sigma$ value (average difference) of the shift of the reticle for the best matching accuracy, is memorized.

Subsequently, such direction and amount of shift of the reticle for the best matching accuracy are found by simulation while the reticle is shifted by a slight amount in various directions from the design position. The result (B) of the then evaluation is memorized.

Next, such a magnification adjustment coefficient for the best matching accuracy is found by simulation when only the magnification is finely adjusted to various values, and the result (C) of the then evaluation is memorized.

Subsequently, such direction and amount of shift and such a magnification adjustment coefficient for the best matching accuracy are found by simulation with respect to a case where both the shift of the wafer and magnification adjustment are used, and the result (D) of the then evaluation is memorized.

Likewise, such direction and amount of shift and such a magnification adjustment coefficient for the best matching accuracy are found by simulation with respect to a case where both the shift of the reticle and magnification adjustment are used, and the result (E) of the then evaluation is memorized.

Subsequently, such directions and amounts of shift of the reticle and wafer for the best matching accuracy are found by simulation with respect to a case where both of the reticle and wafer are shifted relative to each other without magnification adjustment being effected, and the result (F) of the then evaluation is memorized.

More strictly, it is likewise necessary to effect simulation with respect to a case where the shift of the reticle, the shift of the wafer and magnification adjustment are used together, Practically, however, it almost suffices either to obtain an optimum simulation result by the shift of the wafer and magnification adjustment and thereafter trying to further shift the reticle, or to obtain an optimum simulation result by the shift of the reticle and magnification adjustment and thereafter trying to further shift the wafer. Therefore, in the present embodiment, the evaluation by the simulation when the three are used together is omitted.

Subsequently, one of the above-described results (A)-(F) of the evaluation for which the $\sigma$ value is smallest is chosen, and the data of the direction and amount of shift of the reticle or wafer and the magnification adjustment coefficient which correspond thereto are newly memorized. If, in this case, for example, such a result that only the shift of the reticle is effected comes out, a predetermined value will be stored in a memory which memorizes the shift vector (direction and amount) of the reticle and zero will be stored in both of memories which memorize the shift vector of the wafer and the magnification adjustment coefficient, respectively.

Now, when the shift of the wafer is necessary, the design shot arrangement data is modified correspondingly to the shift vector of the wafer. When at this time, it is also necessary to shift the reticle in a different direction for each shot, a flag representing the shift vector of the reticle is provided in the arrangement data corresponding to each shot.

Each operation process hitherto described is effected by a computer which processes a great deal of data at a high speed, but yet requires a considerable time and therefore, it is desirable to use a discrete computer different from the main control device of the exposure apparatus.

Next, when magnification adjustment is necessary prior to the exposure to the wafer, the pressure adjuster BC is controlled in conformity with the adjustment coefficient and corrected to a predetermined projection magnification.

The stage ST is caused to effect stepping on the basis of the modified shot arrangement data and if the flag of the reticle shift appears in that data, the reticle is finely moved correspondingly to a predetermined shift vector conforming to the kind of that flag, and it is repeated to superposition-expose the pattern of the reticle to the exposed area on the wafer at that position.

In the manner described above, all the exposed areas on the wafer are superposition-exposed with the best matching accuracy. By selecting one or a switable combination of the reticle shift, the wafer shift and magnification adjustment, the relative error of the distortion of the exposed area on the wafer (including the distortion of the exposure apparatus in the preceding step) and the distortion of the stepper for superposition can be minimized and also, the degree of freedom with which the most efficient technique in the construction of the exposure apparatus can be selected is enhanced.

Each of the above-described embodiments of the present invention has been a case where two steppers are used together, but a similar effect may be obtained in any other case where the exposure apparatus and steppers are used together. Particularly in the use of an aligner such as mirror projection together with steppers, when superposition-exposure is to be effected by the steppers on the wafer exposed by the aligner, the distortion inherent to the aligner created on the entire surface of the wafer can be superposed while being uniformly added to each shot by the steppers and therefore, the matching accuracy is greatly improved.

We claim:

1. An exposure method for photolithography comprising the steps of:
   (a) forming a first pattern on a substrate by the use of a first exposure apparatus including a first imaging optical system having a reduction magnification $1/\beta_1$ and an image circle of a diameter $\phi_1$; and
   (b) forming a second pattern on said substrate on which said first pattern has been formed, by the use of a second exposure apparatus including a second imaging optical system having a reduction magnification $1/\beta_2$ different from said reduction magnification $1/\beta_1$ and an image circle of a diameter $\phi_2$, wherein when N is an integer, the conditions that $\beta_1 \times \phi_1 = \beta_2 \times \phi_2$ and $\phi_1 = N \times \phi_2$ are satisfied.

2. A method of exposing a substrate for photolithography by the successive use of a first exposure apparatus having a first projection optical system and a second exposure apparatus having a second projection optical system, comprising the steps of:
   (a) comparing a first distortion characteristic within the projection range from the center of the field of view of said first projection optical system to a predetermined image height position and a second distortion characteristic within the projection range from the center of the field of view of said second projection optical system to said predetermined image height position during each relative magnification change of said first and second projection optical systems;
   (b) changing the projection magnification of at least one of said first and second projection optical systems so that said first and second distortion characteristics are most coincident with each other; and
   (c) disposing said substrate substantially at the same position relative to the centers of the fields of view of said first and second projection optical systems and exposing said substrate by said first and second exposure apparatuses in succession.

3. A method according to claim 2, wherein said step of changing the projection magnification includes the step of finding the maximum one of the absolute values of the difference in amount of distortion at each image height position between said first and second distortion characteristics, and the step of determining such a relative projection magnification between said first and second projection optical systems that said maximum absolute value is smallest.

4. A method according to claim 3, wherein said step of changing the projection magnification further includes the step of changing both of the projection magnifications of said first and second projection optical systems substantially by the same amount while maintaining said determined relative magnification to keep the absolute magnifications of said first and second projection optical systems substantially constant.

5. A method of superposition-exposing a substrate for photolithography by the successive use of a first exposure apparatus having a first projection optical system and a second exposure apparatus having a second projection optical system, comprising the steps of:
   (a) comparing a two-dimensional first distortion of the projected image by said first projection optical system and a two-dimensional second distortion of the projected image by said second projection optical system formed on partial areas on said substrate which are superposition-exposed;
   (b) determining the amount of relative shift in two-dimensional directions of the projected images by said first and second projection optical systems for minimizing a superposition error caused by the difference between said first distortion and said second distortion; and
   (c) exposing said substrate by said first and second exposure apparatuses in succession in a positional relation in which said projected images are shifted by said amount of shift from a design position.

6. A method according to claim 5, wherein said substrate is moved relative to said projected images in accordance with the determined amount of relative shift.

7. A method according to claim 5, wherein said projection image by said second projection optical system is projected onto said partial areas on which said projection image by said first projection optical system has been formed.

8. A method according to claim 7, wherein said second projection optical system projects an image of an object onto said substrate, and said object is moved relative to said substrate in accordance with the determined amount of relative shift.

9. An exposure system for photolithography comprising:
   a first exposure apparatus for forming a first pattern on a substrate, said first exposure apparatus including a first imaging optical system having a reduction magnification $1/\beta1$ and an image circle of a diameter $\phi1$; and a second exposure apparatus for superposing and forming a second pattern on the first pattern on said substrate, said second exposure apparatus including a second imaging optical system having a reduction magnification $1/\beta2$ different from said reduction magnification $1/\beta1$ and an image circle of a diameter $\phi2$, wherein when N is an integer, the conditions that $\beta1 \times \phi1 = \beta2 \times \phi2$ and $\phi1 = N \times \phi2$ are satisfied.

10. An exposure system for photolithography comprising:

a first exposure apparatus having a first projection optical system and means for supporting a substrate for photolithography so that the exposure center of said substrate is substantially coincident with the center of the projection field of view of said first projection optical system;

a second exposure apparatus having a second projection optical system and means for supporting said substrate so that the same exposure center of said substrate is substantially coincident with the center of the projection field of view of said second projection optical system; and means for comparing a first distortion characteristic within the projection range from the center of the projection field of view of said first projection optical system to a predetermined image height position and a second distortion characteristic within the projection range from the center of the projection field of view of said second projection optical system to said predetermined image height position, and varying the projection magnification of at least one of said first and second projection optical systems so that said first and second distortion characteristics are most coincident with each other.

11. An exposure method for photolithography comprising the steps of:

(a) forming a first pattern on a substrate by the use of a first exposure apparatus including a first imaging optical system; and (b) forming a second pattern on said substrate by the use of a second exposure apparatus including a second imaging optical system having a magnification different from a magnification of said first imaging optical system, wherein when $\beta_1$ and $\phi_1$ are the magnification and a diameter of an image circle with respect to one of said first and second imaging optical systems, $\beta_2$ and $\phi_2$ are the magnification and a diameter of an image circle with respect to the other of said first and second imaging optical systems and when N is an integer, the conditions that $\beta_1 \times \phi_1 = \beta_2 \times \phi_2$ and $\phi_1 = N \times \phi_2$ are satisfied.

12. A method of superposition-exposing a substrate for photolithography by the successive use of a first exposure apparatus having a first projection optical system and a second exposure apparatus having a second projection optical system, comprising the steps of:

(a) comparing a two-dimensional first distortion characteristic of said first projection optical system and a two-dimensional second distortion characteristic of said second projection optical system;

(b) determining the amount of relative shift in two-dimensional directions of projection images formed on a partial area on said substrate by said first and second projection optical systems for minimizing a superposition error caused by the difference between said first distortion characteristic and said second distortion characteristic;

(c) changing the projection magnification of at least one of said first and second projection optical systems so that said first and second distortion characteristics are most coincident with each other within said partial area; and (d) exposing said substrate by said first and second exposure apparatuses in succession in a positional relation in which said projected images are shifted by said amount of shift from a design position.

13. An exposure system for photolithography comprising:

a first exposure apparatus for forming a first pattern on a substrate, said first exposure apparatus including a first imaging optical system; and a second exposure apparatus for forming and superposing a second pattern on the first pattern on said substrate, said second exposure apparatus including a second imaging optical system having a magnification different from a magnification of said first imaging optical system, wherein when $\beta_1$ and $\phi_1$ are the magnification and a diameter of an image circle with respect to one of said first and second imaging optical system, $\beta_2$ and $\phi_2$ are the magnification and a diameter of an image circle with the respect to the other of said first and second imaging optical systems and when N is an integer, the conditions that $\beta_1 \times \phi_1 = \beta_2 \times \phi_2$ and $\phi_1 = N \times \phi_2$ are satisfied.

14. An exposure system for photolithography comprising:

a first exposure apparatus includiog a first projection optical system having a two-dimensional first distortion and means for supporting a substrate for photolithography so that a partial area of said substrate is exposed to a projected image by said first projection optical system;

a second exposure apparatus including a second projection optical system having a two-dimensional second distortion and means for supporting said substrate for photolithography so that said partial area of said substrate is exposed to a projected image by said second projection optical system; and means for comparing said first distortion and said second distortion and causing relative shift in two-dimensional directions of the projected images by said first and second projection optical systems so that a superposition error caused by the difference between said first distortion and said second distortion is minimized.

15. A system according to claim 14, wherein said comparing and relative shift causing means includes means for determining the amount of said relative shift and means for moving said substrate in accordance with the determined amount.

16. A system according to claim 14, wherein said second exposure apparatus further included means for supporting an object and said second projection optical system forms a projected image of said object on said partial area of said substrate, and wherein said comparing and relative shift causing means includes means for moving said object relative to said substrate.

17. A system according to claim 16, wherein said comparing and relative shift causing means further includes means for determining the amount of said relative shift.

18. An exposure system for photolithography comprising:
- a first exposure apparatus including a first projection optical system having a two-dimensional first distortion characteristic and means for supporting a substrate for photolithography so that a partial area of said substrate is exposed to a projected image by said first projection optical system;
- a second exposure apparatus including a second projection optical system having a two-dimensional second distortion characteristic and means for supporting said substrate for photolithography so that said partial area of said substrate is exposed to a projected image by said second projection optical system; and
- means for comparing said first distortion characteristic within said partial area and said second distortion characteristic within said partial area, and varying the projection magnification of at least one of said first and second projection optical systems so that said first and second distortion characteristics are most coincident with each other.

19. A system according to claim 18 further comprising means for causing relative shift in two-dimensional directions of the projected images by said first and second projection optical systems so that a superposition error caused by the difference between said first and second distortion characteristics is minimized within said partial area.

* * * * *